(12) United States Patent
Sakui

(10) Patent No.: US 10,978,155 B2
(45) Date of Patent: *Apr. 13, 2021

(54) 3D NAND MEMORY Z-DECODER

(71) Applicant: Micron Technology, Inc., Boise, ID (US)

(72) Inventor: Koji Sakui, Setagayaku (JP)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/709,322

(22) Filed: Dec. 10, 2019

(65) Prior Publication Data

US 2020/0160913 A1    May 21, 2020

Related U.S. Application Data

(63) Continuation of application No. 16/107,357, filed on Aug. 21, 2018, now Pat. No. 10,510,414, which is a
(Continued)

(51) Int. Cl.
*G11C 16/08* (2006.01)
*G11C 16/04* (2006.01)
(Continued)

(52) U.S. Cl.
CPC .......... *G11C 16/08* (2013.01); *G11C 16/0483* (2013.01); *H01L 27/1157* (2013.01);
(Continued)

(58) Field of Classification Search
None
See application file for complete search history.

(56) References Cited

U.S. PATENT DOCUMENTS

| 3,825,907 A | 7/1974 | Sell et al. |
| 4,811,082 A | 3/1989 | Jacobs et al. |

(Continued)

FOREIGN PATENT DOCUMENTS

| CN | 101853858 A | 10/2010 |
| CN | 103620781 A | 3/2014 |

(Continued)

OTHER PUBLICATIONS

U.S. Appl. No. 13/096,822 U.S. Pat. No. 8,860,117, filed Apr. 28, 2011, Semiconductor Apparatus With Multiple Tiers of Memory Cells With Peripheral Transistors, and Methods.
(Continued)

*Primary Examiner* — Tan T. Nguyen
(74) *Attorney, Agent, or Firm* — Schwegman Lundberg & Woessner, P.A.

(57) ABSTRACT

Apparatus and methods are disclosed, including an apparatus having first and second units of vertically arranged strings of memory cells, each unit including multiple tiers of a semiconductor material, including multiple tiers of memory cells, each tier of memory cells including an access line of at least one memory cell. The access line of a first tier of the first unit can be selectively coupled to a first drive transistor through a first decoder transistor, the access line of a first tier of the second unit can be selectively coupled to the first drive transistor through a second decoder transistor, and the access line of the first tier of the first unit can be selectively coupled to the access line of the first tier of the second unit through the first and second decoder transistors.

20 Claims, 18 Drawing Sheets

Related U.S. Application Data continuation of application No. 15/606,493, filed on May 26, 2017, now Pat. No. 10,074,431, which is a continuation of application No. 15/148,408, filed on May 6, 2016, now Pat. No. 9,679,650.

(51) Int. Cl.

| | |
|---|---|
| *H01L 27/11529* | (2017.01) |
| *H01L 27/11556* | (2017.01) |
| *H01L 27/11573* | (2017.01) |
| *H01L 27/11582* | (2017.01) |
| *H01L 27/11524* | (2017.01) |
| *H01L 27/1157* | (2017.01) |
| *G11C 8/12* | (2006.01) |
| *G11C 8/14* | (2006.01) |

(52) U.S. Cl.
CPC .. *H01L 27/11524* (2013.01); *H01L 27/11529* (2013.01); *H01L 27/11556* (2013.01); *H01L 27/11573* (2013.01); *H01L 27/11582* (2013.01); *G11C 8/12* (2013.01); *G11C 8/14* (2013.01)

(56) References Cited

U.S. PATENT DOCUMENTS

| | | | |
|---|---|---|---|
| 5,680,347 A | 10/1997 | Takeuchi et al. | |
| 5,732,018 A | 3/1998 | Choi et al. | |
| 5,805,498 A | 9/1998 | Lee et al. | |
| 5,818,756 A | 10/1998 | Sakui et al. | |
| 5,859,802 A * | 1/1999 | Lee | G11C 29/84 365/200 |
| 6,344,814 B1 * | 2/2002 | Lin | G09G 3/3685 341/144 |
| 6,621,735 B2 | 9/2003 | Nakamura et al. | |
| 7,554,832 B2 | 6/2009 | Fasoli et al. | |
| 7,852,676 B2 | 12/2010 | Maejima | |
| 7,859,902 B2 | 12/2010 | Maejima | |
| 7,920,408 B2 | 4/2011 | Azuma et al. | |
| 8,098,520 B2 | 1/2012 | Seigler | |
| 8,576,629 B2 | 11/2013 | Choe et al. | |
| 8,619,471 B2 | 12/2013 | Tanzawa | |
| 8,681,555 B2 | 3/2014 | Liu | |
| 8,709,894 B2 | 4/2014 | Lee et al. | |
| 8,837,222 B2 | 9/2014 | Tanzawa | |
| 8,860,117 B2 | 10/2014 | Tanzawa | |
| 8,964,474 B2 | 2/2015 | Morooka et al. | |
| 8,984,214 B2 | 3/2015 | Chen et al. | |
| 9,076,528 B2 | 7/2015 | Porterfield | |
| 9,128,637 B2 | 9/2015 | Manning | |
| 9,152,512 B2 | 10/2015 | Cronin et al. | |
| 9,165,653 B2 | 10/2015 | Asnaashari et al. | |
| 9,170,898 B2 | 10/2015 | Porterfield | |
| 9,362,300 B2 | 6/2016 | Lu et al. | |
| 9,437,610 B2 | 9/2016 | Maejima | |
| 9,543,003 B2 | 1/2017 | Lee et al. | |
| 9,679,650 B1 | 6/2017 | Sakui | |
| 9,704,876 B2 | 7/2017 | Tanzawa | |
| 10,074,430 B2 | 9/2018 | Sakui | |
| 10,074,431 B2 * | 9/2018 | Sakui | H01L 27/1157 |
| 10,269,429 B2 | 4/2019 | Morooka et al. | |
| 10,354,730 B2 | 7/2019 | Sakui | |
| 10,510,414 B2 * | 12/2019 | Sakui | H01L 27/11573 |
| 10,580,790 B2 | 3/2020 | Tanzawa | |
| 10,803,944 B2 | 10/2020 | Morooka et al. | |
| 2003/0147269 A1 | 8/2003 | Nishihara | |
| 2004/0073745 A1 | 4/2004 | Ma et al. | |
| 2005/0226049 A1 | 10/2005 | Jeong et al. | |
| 2006/0126397 A1 | 6/2006 | Tanishima | |
| 2006/0146608 A1 | 7/2006 | Fasoli et al. | |
| 2006/0203547 A1 | 9/2006 | Takeuchi | |
| 2006/0245249 A1 | 11/2006 | Hwang | |
| 2007/0030737 A1 | 2/2007 | Aritome | |
| 2007/0161162 A1 | 7/2007 | Jeng | |
| 2007/0252201 A1 | 11/2007 | Kito et al. | |
| 2008/0099819 A1 | 5/2008 | Kito et al. | |
| 2008/0180994 A1 | 7/2008 | Katsumata et al. | |
| 2008/0258129 A1 | 10/2008 | Toda | |
| 2008/0303083 A1 | 12/2008 | Oyu | |
| 2009/0161474 A1 | 6/2009 | Scheuerlein et al. | |
| 2009/0168534 A1 | 7/2009 | Park et al. | |
| 2009/0224330 A1 | 9/2009 | Hong et al. | |
| 2009/0244968 A1 | 10/2009 | Maejima | |
| 2009/0267139 A1 | 10/2009 | Maejima | |
| 2009/0268522 A1 | 10/2009 | Maejima | |
| 2009/0268524 A1 | 10/2009 | Maejima | |
| 2010/0002516 A1 | 1/2010 | Sim et al. | |
| 2010/0067300 A1 | 3/2010 | Nakamura | |
| 2010/0109071 A1 | 5/2010 | Tanaka et al. | |
| 2010/0177566 A1 | 7/2010 | Kim et al. | |
| 2010/0181612 A1 | 7/2010 | Kito et al. | |
| 2010/0207185 A1 | 8/2010 | Lee et al. | |
| 2010/0207186 A1 | 8/2010 | Higashi et al. | |
| 2010/0214838 A1 | 8/2010 | Hishida et al. | |
| 2010/0226195 A1 | 9/2010 | Lue | |
| 2010/0232207 A1 | 9/2010 | Maejima et al. | |
| 2010/0238732 A1 | 9/2010 | Hishida et al. | |
| 2010/0270529 A1 | 10/2010 | Lung | |
| 2010/0270593 A1 | 10/2010 | Lung et al. | |
| 2010/0314678 A1 | 12/2010 | Lim et al. | |
| 2010/0315881 A1 | 12/2010 | Kim et al. | |
| 2010/0320526 A1 | 12/2010 | Kidoh et al. | |
| 2010/0320528 A1 | 12/2010 | Jeong et al. | |
| 2010/0321981 A1 | 12/2010 | Jeon et al. | |
| 2010/0321984 A1 | 12/2010 | Rahim et al. | |
| 2010/0321998 A1 | 12/2010 | Jang | |
| 2010/0322000 A1 | 12/2010 | Shim et al. | |
| 2010/0327339 A1 | 12/2010 | Tanaka et al. | |
| 2011/0013454 A1 | 1/2011 | Hishida et al. | |
| 2011/0049611 A1 | 3/2011 | Kiyotoshi et al. | |
| 2011/0063916 A1 | 3/2011 | Maeda | |
| 2011/0169071 A1 | 7/2011 | Uenaka et al. | |
| 2011/0182105 A1 | 7/2011 | Yan et al. | |
| 2011/0216603 A1 | 9/2011 | Han et al. | |
| 2011/0249503 A1 | 10/2011 | Yamada et al. | |
| 2011/0286283 A1 | 11/2011 | Lung et al. | |
| 2012/0063194 A1 | 3/2012 | Baek et al. | |
| 2012/0075934 A1 | 3/2012 | Louie et al. | |
| 2012/0134210 A1 | 5/2012 | Maeda | |
| 2012/0273862 A1 | 11/2012 | Tanzawa | |
| 2013/0051145 A1 | 2/2013 | Ahn | |
| 2013/0051146 A1 | 2/2013 | Yun et al. | |
| 2013/0235673 A1 | 9/2013 | Kwak | |
| 2013/0258745 A1 | 10/2013 | Tanzawa | |
| 2013/0258785 A1 | 10/2013 | Sakui | |
| 2013/0272067 A1 | 10/2013 | Lee et al. | |
| 2013/0277731 A1 | 10/2013 | Goda et al. | |
| 2013/0336065 A1 | 12/2013 | Morooka et al. | |
| 2014/0036590 A1 | 2/2014 | Feeley | |
| 2014/0056049 A1 | 2/2014 | Tanzawa | |
| 2014/0061747 A1 | 3/2014 | Tanzawa et al. | |
| 2014/0063959 A1 | 3/2014 | Tanzawa | |
| 2014/0104918 A1 | 4/2014 | Castro et al. | |
| 2014/0104948 A1 | 4/2014 | Rhie | |
| 2014/0119117 A1 | 5/2014 | Sakui et al. | |
| 2014/0192594 A1 | 7/2014 | Lue | |
| 2014/0219025 A1 | 8/2014 | Kang | |
| 2014/0313839 A1 | 10/2014 | Sakui et al. | |
| 2014/0362650 A1 * | 12/2014 | Castro | G11C 13/0028 365/189.011 |
| 2014/0369116 A1 | 12/2014 | Sakui | |
| 2015/0003150 A1 | 1/2015 | Aritome | |
| 2015/0003158 A1 | 1/2015 | Aritome | |
| 2015/0021609 A1 | 1/2015 | Tanzawa | |
| 2015/0070994 A1 | 3/2015 | Hosono et al. | |
| 2015/0162084 A1 | 6/2015 | Morooka et al. | |
| 2015/0228349 A1 | 8/2015 | Park et al. | |
| 2015/0255161 A1 | 9/2015 | Lee et al. | |
| 2015/0262682 A1 | 9/2015 | Futatsuyama et al. | |
| 2015/0294722 A1 | 10/2015 | Fukano | |
| 2015/0340096 A1 | 11/2015 | Shim et al. | |
| 2015/0357344 A1 | 12/2015 | Tanzawa | |
| 2015/0380097 A1 | 12/2015 | Sato et al. | |

(56) References Cited

U.S. PATENT DOCUMENTS

| | | | |
|---|---|---|---|
| 2016/0064088 A1 | 3/2016 | Shiga et al. |
| 2016/0086669 A1 | 3/2016 | Kim et al. |
| 2016/0104717 A1 | 4/2016 | Lu et al. |
| 2016/0111161 A1 | 4/2016 | Louie et al. |
| 2016/0148703 A1 | 5/2016 | Kim et al. |
| 2016/0163390 A1 | 6/2016 | Park |
| 2016/0172041 A1 | 6/2016 | Sakui |
| 2016/0180934 A1 | 6/2016 | Sakui et al. |
| 2016/0284728 A1 | 9/2016 | Lu et al. |
| 2017/0110198 A1 | 4/2017 | Zhao et al. |
| 2017/0309641 A1 | 10/2017 | Tanzawa |
| 2017/0330626 A1 | 11/2017 | Sakui |
| 2018/0040377 A1 | 2/2018 | Sakui |
| 2018/0197949 A1 | 7/2018 | Ramaswamy |
| 2018/0358096 A1 | 12/2018 | Sakui |
| 2018/0366198 A1 | 12/2018 | Sakui |
| 2019/0362792 A1 | 11/2019 | Oh et al. |
| 2020/0005869 A1 | 1/2020 | Morooka et al. |
| 2020/0203377 A1 | 6/2020 | Tanzawa |

FOREIGN PATENT DOCUMENTS

| | | |
|---|---|---|
| CN | 201280028890.6 | 2/2017 |
| CN | 108140416 A | 6/2018 |
| CN | 106935255 B | 4/2020 |
| EP | 2702610 B1 | 9/2016 |
| JP | 2001298194 A | 10/2001 |
| JP | 2009212280 A | 9/2009 |
| JP | 2010114113 A | 5/2010 |
| JP | 2010165794 A | 7/2010 |
| JP | 2010166055 A | 7/2010 |
| JP | 2010187001 A | 8/2010 |
| KR | 20060100993 A | 9/2006 |
| KR | 20100003629 A | 1/2010 |
| KR | 1020100003629 A | 1/2010 |
| KR | 10-1865169 | 5/2018 |
| KR | 102080572 B1 | 2/2020 |
| TW | 381267 B | 2/2000 |
| TW | 200710851 A | 3/2007 |
| TW | 201308577 A | 2/2013 |
| TW | 201407630 A | 2/2013 |
| TW | I524356 B | 3/2016 |
| TW | 201612899 A | 4/2016 |
| TW | 201905907 A | 2/2019 |
| WO | WO-2012149424 A2 | 11/2012 |
| WO | WO-2012149424 A3 | 11/2012 |
| WO | WO-2013188399 A1 | 12/2013 |
| WO | WO-2018031474 A1 | 2/2018 |

OTHER PUBLICATIONS

U.S. Appl. No. 14/511,340, U.S. Pat. No. 9,704,876, filed Oct. 10, 2014, Semiconductor Apparatus With Multiple Tiers, and Methods.
U.S. Appl. No. 15/645,635, filed Jul. 10 2017, Semiconductor Apparatus With Multiple Tiers, and Methods.
U.S. Appl. No. 13/524,872 U.S. Pat. No. 8,964,474, filed Jun. 15, 2012, Architecture for 3-D Nand Memory.
U.S. Appl. No. 14/626,540 U.S. Pat. No. 10,269,429, filed Feb. 19, 2015, Architecture for 3-D Nand Memory.
U.S. Appl. No. 16/378,090, filed Apr. 8, 2019, Architecture for 3-D Nand Memory.
U.S. Appl. No. 15/148,408 U.S. Pat. No. 9,679,650, filed May 6, 2016, 3D Nand Memory Z-Decoder
U.S. Appl. No. 15/606,493 U.S. Pat. No. 10,074,431, filed May 26, 2017, 3D Nand Memory Z-Decoder.
U.S. Appl. No. 16/107,357 U.S. Pat. No. 10,510,414, filed Aug. 21, 2018, 3D Nand Memory Z-Decoder.
U.S. Appl. No. 16/546,720, filed Aug. 21, 2019, Multi-Deck Memory Device Including Buffer Circuitry Under Array.
"Chinese Application Serial No. 201280028890.6, Office Action dated Apr. 21, 2016", W/ English Translation, 12 pgs.
"Chinese Application Serial No. 201280028890.6, Office Action dated Oct. 12, 2015", W/ English Translation, 8 pgs.
"Chinese Application Serial No. 201280028890.6, Response filed Jan. 4, 2016 to Office Action dated Oct. 12, 2015", W/ English Claims, 26 pgs.
"Chinese Application Serial No. 201280028890.6, Response filed Jul. 5, 2016 to Office Action dated Apr. 21, 2016", W/ English Claims, 27 pgs.
"Chinese Application Serial No. 201710001454.4, Office Action dated May 23, 2019", w/English Translation, 22 pgs.
"Chinese Application Serial No. 201710001454.4, Office Action dated Jul. 30, 2018", W/ English Translation, 12 pgs.
"Chinese Application Serial No. 201710001454.4, Response Filed Feb. 14, 2019 to Office Action dated Jul. 30, 2018", w/English Claims, 18 pgs.
"European Application Serial No. 12776549.3 Response filed Mar. 10, 2015 to Extended European Search Report dated Mar. 10, 2015", 18 pgs.
"European Application Serial No. 12776549.3, Communication under Rule 71(3) dated Mar. 31, 2016", 59 pgs.
"European Application Serial No. 12776549.3, Extended European Search Report dated Oct. 14, 2014", 6 pgs.
"European Application Serial No. 12776549.3, Preliminary Amendment filed Jun. 11, 2014", 9 pgs.
"International Application Serial No. PCT/US2012/035596, International Preliminary Report on Patentability dated Nov. 7, 2013", 8 pgs.
"International Application Serial No. PCT/US2012/035596, International Search Report dated Jan. 10, 2013", 5 pgs.
"International Application Serial No. PCT/US2012/035596, Invitation to Pay Additional Fees and Partial Search Report dated Nov. 26, 2012", 7 pgs.
"International Application Serial No. PCT/US2012/035596, Written Opinion dated Jan. 10, 2013", 6 pgs.
"International Application Serial No. PCT/US2013/045173, International Preliminary Report on Patentability dated Dec. 24, 2014", 8 pgs.
"International Application Serial No. PCT/US2013/045173, International Search Report dated Sep. 26, 2013", 3 pgs.
International Application Serial No. PCT/US2013/045173, Written Opinion dated Sep. 26, 2013, 6 pgs.
"Japanese Application Serial No. 2014-508138, Non Final Office Action dated Oct. 13, 2015", W/ English Translation, 10 pgs.
"Japanese Application Serial No. 2014-508138, Office Action dated May 19, 2015", w/English Translation, 9 pgs.
"Japanese Application Serial No. 2014-508138, Response Filed Jan. 7, 2016 to Non Final Office Action dated Oct. 13, 2015", w/English Translation, 7 pgs.
"Japanese Application Serial No. 2014-508138, Response filed Aug. 10, 2015 to Office Action dated May 19, 2015", W/ English Claims, 14 pgs.
"Korean Application Serial No. 10-2013-7031681, Office Action dated Jun. 29, 2017", W/ English Translation, 34 pgs.
"Korean Application Serial No. 10-2013-7031681, Response filed Nov. 28, 2017 for Office Action dated Jun. 29, 2017", w/English Claims, 31 pgs.
"Korean Application Serial No. 10-2018-7015490, Notice of Preliminary Rejection dated Feb. 2, 2019", w/English Translation, 20 pgs.
"Korean Application Serial No. 10-2018-7015490, Response filed May 23, 2019 to Notice of Preliminary Rejection dated Feb. 27, 2019", w/ English Claims, 17 pgs.
"Taiwanese Application Serial No. 101115256, Amendment filed Apr. 9, 2015", w/English Claims.
"Taiwanese Application Serial No. 101115256, Decision of Rejection dated May 9, 2016", W/ English Translation, 6 pgs.
"Taiwanese Application Serial No. 101115256, Office Action dated Sep. 14, 2015", W/ English Translation, 7 pgs.
"Taiwanese Application Serial No. 101115256, Response filed Mar. 15, 2016 to Office Action dated Sep. 14, 2015", w/English Claims, 38 pgs.
"Taiwanese Application Serial No. 102121223, Office Action dated Aug. 13, 2015", W/ English Translation, 3 pgs.

(56) References Cited

OTHER PUBLICATIONS

"Taiwanese Application Serial No. 102121223, Response filed Nov. 12, 2015 to Office Action dated Agu. 13, 2015", W/ English Claims, 14 pgs.
"Taiwanese Application Serial No. 102121223, Supplemental Voluntary Amendment filed Jul. 2, 2015", W/ English Claims, 7 pgs.
"Taiwanese Application Serial No. 102121223, Voluntary Amendment filed Apr. 3, 2014", W/ English Claims, 36 pgs.
"Taiwanese Application Serial No. 1041143893, Response filed May 22, 2017 to Office Action dated Feb. 18, 2017", w/English Translation, 36 pgs.
"Taiwanese Application Serial No. 104143893, Office Action dated Feb. 18, 2017", w/English Translation, 13 pgs.
"Taiwanese Application Serial No. 104143893, Office Action dated May 7, 2018", w/English Translation, 19 pgs.
"Taiwanese Application Serial No. 104143893, Office Action dated Oct. 18, 2017", w/English Translation, 8 pgs.
"Taiwanese Application Serial No. 104143893, Response filed Jan. 19, 2018 to Office Action dated Oct. 18, 2017", w/English Claims, 37 pgs.
"Taiwanese Application Serial No. 104143893, Response filed Aug. 9, 2018 to Office Action dated May 7, 2018", w/ English Claims, 36 pgs.
"Taiwanese Application Serial No. 107136222, First Office Action dated Apr. 12, 2019", w/ English translation, 14 pgs.
Chiang, M H, et al., "Novel High-Density Low-Power Logic Circuit Techniques Using DG Devices", IEEE ED, 52(10), (2005), 2339-42.
Crowley, Matthew, et al., "512 Mb PROM with 8 layers of antifuse/diode cells", 2003 IEEE International Solid-State Circuits Conference, 2003. Digest of Technical Papers. ISSCC, (2003), 284-293.
Jang, J., et al., "Vertical cell array using TCAT(Terabit Cell Array Transistor) technology for ultra high density NAND flash memory", Symposium on VLSI Technology, (2009), 192-193.
Johnson, Mark, et al., "512-Mb PROM with a three-dimensional array of diode/antifuse memory cells", IEEE Journal of Solid-State Circuits, 38(11), (2003), 1920-1928.
Katsumata, R., et al., "Pipe-shaped BiCS flash memory with 16 stacked layers and multi-level-cell operation for ultra high density storage devices", Symposium on VLSI Technology, (Jun. 2009), 136-37.
Kim, J., et al., "Novel Vertical-Stacked Array-Transistor (VSAT) for ultra-high-density and cost-effective NAND Flash memory devices and SSD (Solid State Drive)", Symposium on VLSI Technology, (2009), 186-187.
Kim, W., et al., "Multi-layered Vertical Gate NAND Flash overcoming stacking limit for terabit storage", Symposium on VLSI Technology, (2009), 188-89.
Park, Ki-Tae, et al., "A 7MB/s 64Gb 3-Bit/Cell DDR NAND Flash Memory in 20nm-Node Technology", ISSCC 2011 / Session 11 / Non-Volatile Memory Solutions / 11.8, 2011 IEEE International Solid-State Circuits Conference (Digest of Technical Papers), (Feb. 22, 2011), 212-213.
Sakui, K, et al., "Design Impacts on NAND Flash Memory Core Circuits with Vertical MOSFETs", IEEE International Memory Workshop (IMW), (May 2010), 1-4.
Tanaka, H., et al., "Bit Cost Scalable Technology with Punch and Plug Process for Ultra High Density Flash Memory", IEEE Symposium on VLSI Technology, (2007), 14-15.
"Chinese Application Serial No. 17746364.3, Response to Communication pursuantto Rules161(2) and 162 EPC filed Sep. 25, 2019", w/English Claims, 138 pgs.
"Chinese Application Serial No. 201710001454.4, Office Action dated Sep. 27, 2019", w/ English Translation, 39 pgs.
"Chinese Application Serial No. 201710001454.4, Response filed Aug. 6, 2019 to Office Action dated May 23, 2019", w/ English Claims, 19 pgs.
"Chinese Application Serial No. 201710001454.4, Response filed Dec. 4, 2019 to Office Action dated Sep. 27, 2019", w/ English Claims, 95 pgs.

"International Application Serial No. PCT/US2017/045762, International Preliminary Report on Patentability dated Feb. 21, 2019", 9 pgs.
"International Application Serial No. PCT/US2017/045762, International Search Report dated Nov. 10, 2017", 3 pgs.
"International Application Serial No. PCT/US2017/045762, Written Opinion dated Nov. 10, 2017", 7 pgs.
"Korean Application Serial No. 10-2018-7015490, Korean Final Office Action dated Sep. 23, 2019", W/English Translation, 7 pgs.
"Korean Application Serial No. 10-2018-7015490, Response filed Oct. 24, 2019 to Korean Final Office Action dated Sep. 23, 2019", w/ English Claims, 20 pgs.
"Taiwanese Application Serial No. 107136222, Response filed Jul. 12, 2019 to First Office Action dated Apr. 12, 2019", w/ English Claims, 36 pgs.
U.S. Appl. No. 13/096,822, Restriction Requirement dated Jul. 25, 2013, 8 pgs.
U.S. Appl. No. 13/096,822, Response filed Aug. 26, 2013 to Restriction Requirement dated Jul. 25, 2013, 11 pgs.
U.S. Appl. No. 13/096,822, Non Final Office Action dated Nov. 21, 2013, 18 pgs.
U.S. Appl. No. 13/096,822, Response filed Feb. 21, 2014 to Non Final Office Action dated Nov. 21, 2013, 13 pgs.
U.S. Appl. No. 13/096,822, Notice of Allowance dated Jun. 6, 2014, 10 pgs.
U.S. Appl. No. 13/524,872, Non Final Office Action dated Dec. 6, 2013, 19 pgs.
U.S. Appl. No. 13/524,872, Response filed May 6, 2014 to Non Final Office Action dated Dec. 6, 2013, 15 pgs.
U.S. Appl. No. 13/524,872, Final Office Action dated Jul. 24, 2014, 12 pgs.
U.S. Appl. No. 13/524,872, Response filed Sep. 24, 2014 to Final Office Action dated Jul. 24, 2014, 14 pgs.
U.S. Appl. No. 13/524,872, Notice of Allowance dated Oct. 16, 2014, 9 pgs.
U.S. Appl. No. 14/511,340, Restriction Requirement dated Sep. 17, 2015, 7 pgs.
U.S. Appl. No. 14/511,340, Response filed Nov. 17, 2015 to Restriction Requirement dated Sep. 17, 2015, 4 pgs.
U.S. Appl. No. 14/511,340, Ex Parte Quayle Action dated Dec. 17, 2015, 9 pgs.
U.S. Appl. No. 14/511,340, Ex Parte Quayle Action Response filed Feb. 17, 2016, 7 pgs.
U.S. Appl. No. 14/511,340, Notice of Allowance dated Jun. 8, 2016, 8 pgs.
U.S. Appl. No. 14/511,340, Corrected Notice of Allowance dated Jun. 22, 2016, 2 pgs.
U.S. Appl. No. 14/511,340, Notice of Allowance dated Sep. 28, 2016, 9 pgs.
U.S. Appl. No. 14/511,340, Preliminary Amendment filed Dec. 29, 2016, 5 pgs.
U.S. Appl. No. 14/511,340, Notice of Allowance dated Mar. 14, 2017, 8 pgs.
U.S. Appl. No. 14/626,540, Non Final Office Action dated May 17, 2016, 11 pgs.
U.S. Appl. No. 14/625,540, Response filed Aug. 17, 2016 to Non Final Office Action dated May 17, 2016, 8 pgs.
U.S. Appl. No. 14/626,540, Final Office Action dated Sep. 16, 2016, 9 pgs.
U.S. Appl. No. 14/626,540, Response filed Nov. 16, 2016 to Final Office Action dated Sep. 16, 2016, 11 pgs.
U.S. Appl. No. 14/626,540, Advisory Action dated Nov. 25, 2016, 2 pgs.
U.S. Appl. No. 14/626,540, Non Final Office Action dated Feb. 2, 2017, 9 pgs.
U.S. Appl. No. 14/626,540, Response filed May 2, 2017 to Non Final Office Action dated Feb. 2, 2017, 9 pgs.
U.S. Appl. No. 14/626,540, Final Office Action dated Jun. 1, 2017, 9 pgs.
U.S. Appl. No. 14/626,540, Response filed Sep. 1, 2017 to Final Office Action dated Jun. 1, 2017, 8 pgs.
U.S. Appl. No. 14/626,540, Non Final Office Action dated Sep. 13, 2017, 8 pgs.

(56) References Cited

OTHER PUBLICATIONS

U.S. Appl. No. 14/626,540, Response filed Jan. 16, 2018 to Non Final Office Action dated Sep. 13, 2017, 9 pgs.
U.S. Appl. No. 14/626,540, Final Office Action dated Mar. 13, 2018, 9 pgs.
U.S. Appl. No. 14/626,540, Response filed May 14, 2018 to Final Office Action dated Mar. 12, 2018, 8 pgs.
U.S. Appl. No. 14/626,540, Advisory Action dated Jun. 8, 2018, 2 pgs.
U.S. Appl. No. 14/626,540, Response filed Jul. 12, 2018 to Final Office Action dated Mar. 12, 2018, 5 pgs.
U.S. Appl. No. 14/626,540, Notice of Allowance dated Aug. 13, 2018, 7 pgs.
U.S. Appl. No. 14/626,540, Notice of Allowance dated Dec. 20. 2018, 8 pgs.
U.S. Appl. No. 15/148,408, Non Final Office Action dated Oct. 14, 2016, 7 pgs.
U.S. Appl. No. 15/148,408, Response filed Jan. 17, 2017 to Non Final Office Action dated Oct. 14, 2016, 30 pgs.
U.S. Appl. No. 15/148,408, Notice of Allowance dated Feb. 14, 2017, 7 pgs.
U.S. Appl. No. 15/606,493, Non Final Office Action dated Nov. 2, 2017, 11 pgs.
U.S. Appl. No. 15/606,493, Response filed Feb. 2, 2018 to Non-Final Office Action dated Feb. 2, 2017, 8 pgs.
U.S. Appl. No. 15/606,493, Notice of Allowance dated May 9, 2018, 9 pgs.
U.S. Appl. No. 15/645,635, Restriction Requirement dated Aug. 31, 2018, 6 pgs.
U.S. Appl. No. 15/645,635, Response filed Nov. 30, 2018 to Restriction Requirement dated Aug. 31, 2018, 8 pgs.
U.S. Appl. No. 15/645,635, Non Final Office Action dated Mar. 7, 2019, 8 pgs.
U.S. Appl. No. 15/645,635, Response filed Jul. 8, 2019 to Non Final Office Action dated Mar. 7, 2019, 11 pgs.
U.S. Appl. No. 16/107,357, Non Final Office Action dated May 2, 2019, 10 pgs.
U.S. Appl. No. 16/107,357, Response filed Jul. 11, 2019 to Non Final Office Action dated May 2, 2019, 10 pgs.
U.S. Appl. No. 16/107,357, Notice of Allowance dated Aug. 15, 2019, 9 pgs.
U.S. Appl. No. 15,231,011, Restriction Rquirement dated Feb. 2, 2017, 7 pgs.
U.S. Appl. No. 15/231,011, Response filed Apr. 3, 2917 to Restriction Requirement dated Feb. 2, 2017, 9 pgs.
U.S. Appl. No. 15/231,011, Non Final Office Action dated Jul. 3, 2017, 17 pgs.
U.S. Appl. No. 15/231,011, Response filed Oct. 3, 2017 to Non Final Office Action dated Jul. 3, 2017, 14 pgs.
U.S. Appl. No. 15/231,011, Final Office Action dated Dec. 13, 2017, 15 pgs.
U.S. Appl. No. 15/231,011, Response filed Jan. 18, 2018 to Final Office Action dated Dec. 13, 2017, 13 pgs.
U.S. Appl. No. 15/231,011, Advisory Action dated Feb. 23, 2018, 3 pgs.
U.S. Appl. No. 15/231,011, Response filed Feb. 28, 2018 to Final Office Action dated Dec. 13, 2017, 11 pgs.
U.S. Appl. No. 15/231,011, Advisory Action dated Apr. 6, 2018, 4 pgs.
U.S. Appl. No. 15/231,011, Response filed Apr. 6, 2018 to Advisory Action dated Apr. 6, 2018, 11 pgs.
U.S. Appl. No. 15/231,011, Notice of Allowance dated May 10, 2018, 21 pgs.
U.S. Appl. No. 15/645,635, Notice of Allowance dated Oct. 22, 2019, 7 pgs.
U.S. Appl. No. 15/645,635, Corrected Notice of Allowability dated Dec. 4, 2019, 4 pgs.
U.S. Appl. No. 16/108,766, Notice of Allowance dated May 15, 2019, 10 pgs.
U.S. Appl. No. 16/378,090, Preliminary Amendment filed Sep. 23, 2019, 6 pgs.
U.S. Appl. No. 16/806,755, filed Mar. 2, 2020, Semiconductor Apparatus With Multiple Tiers, and Methods.

* cited by examiner

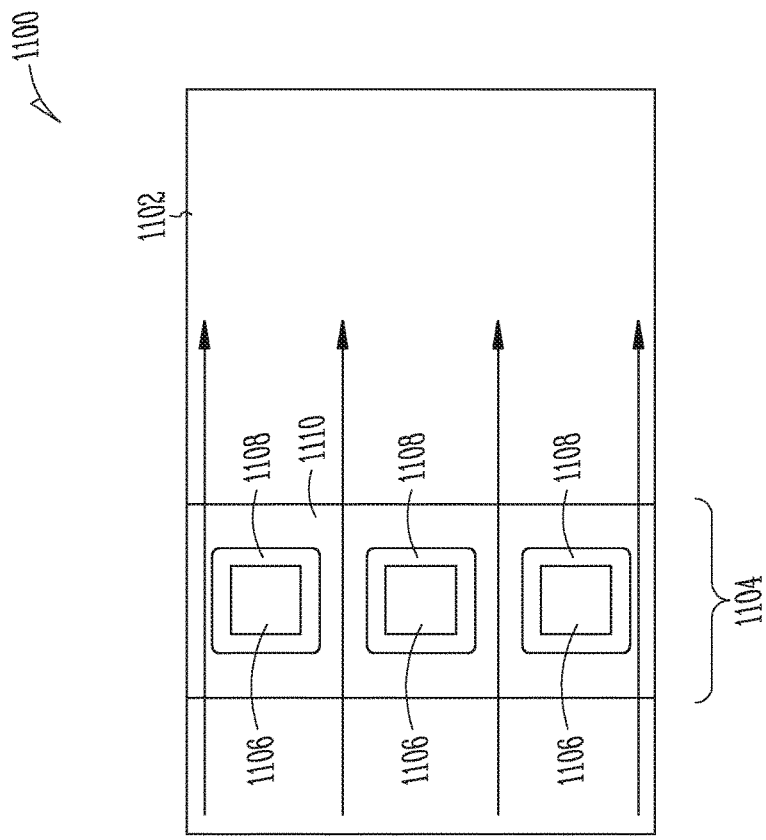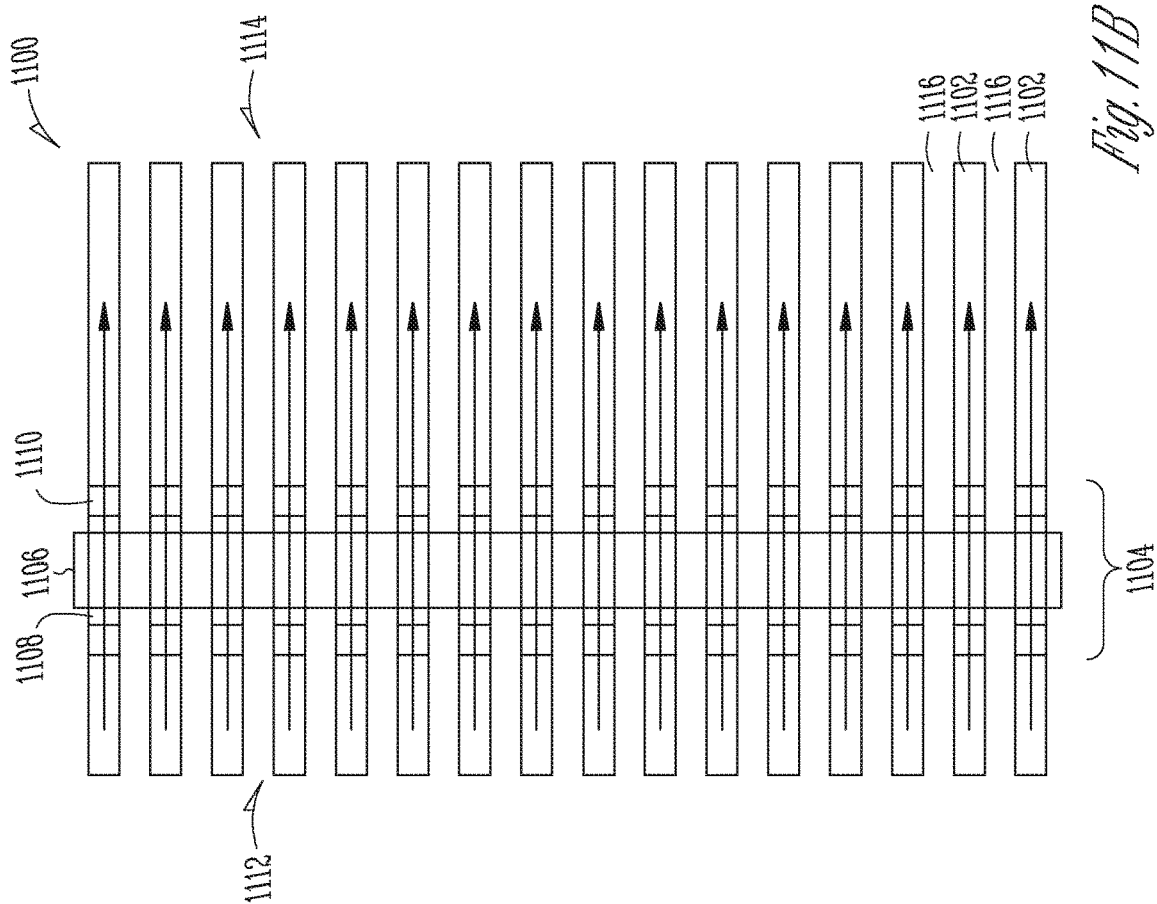

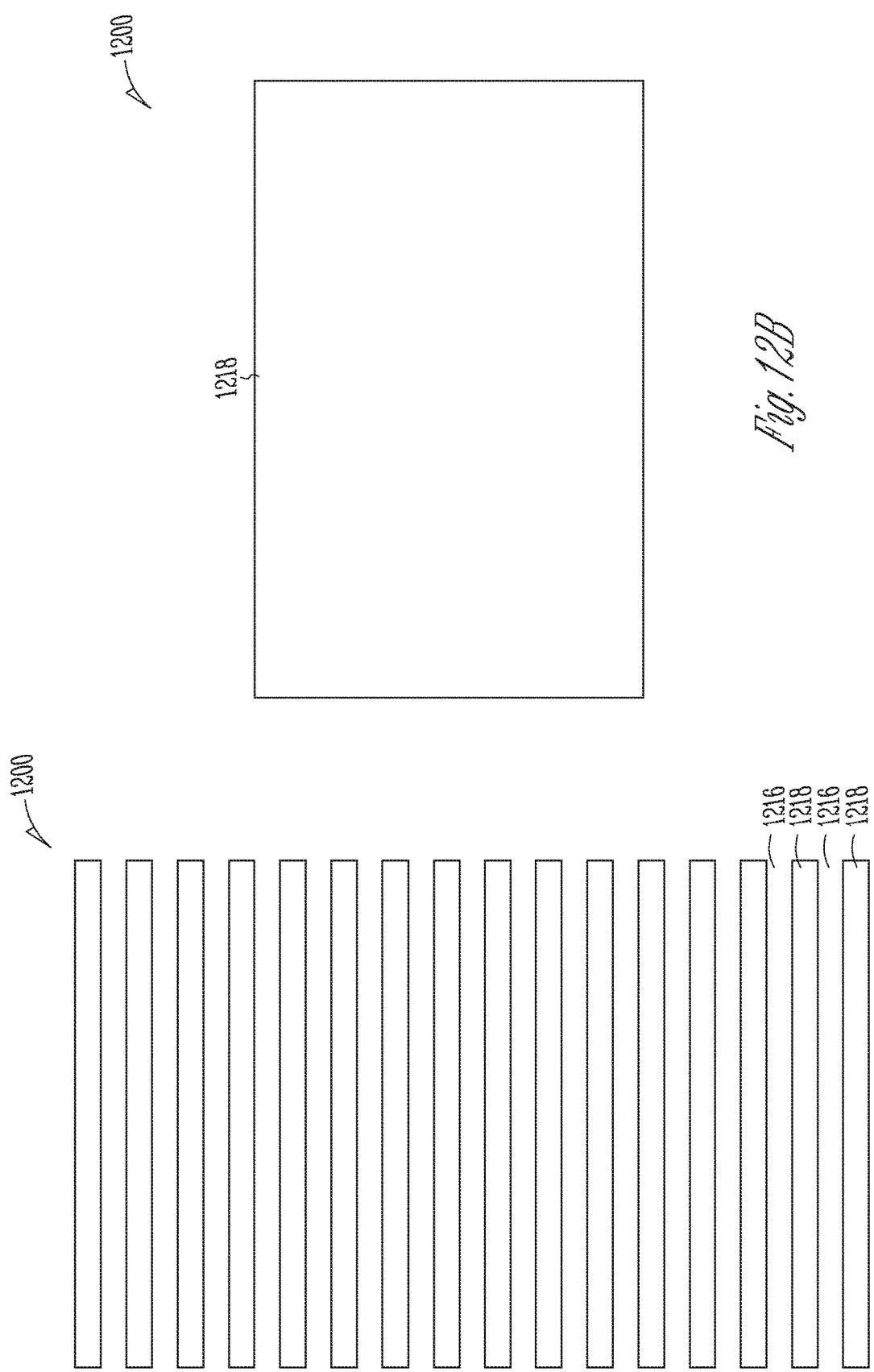

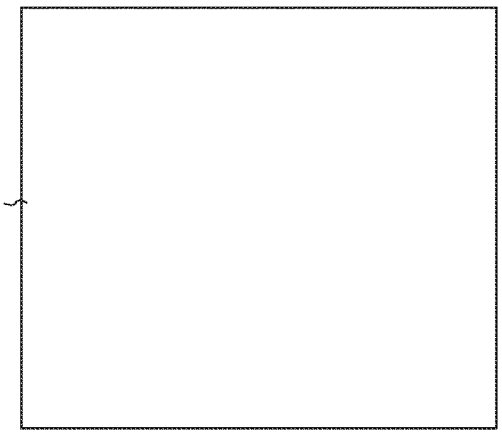
Fig. 13B
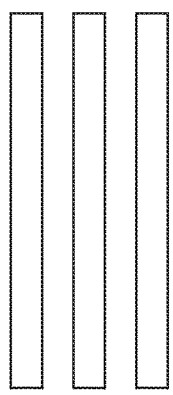
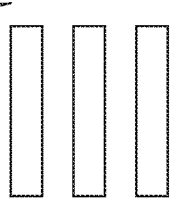
Fig. 13A

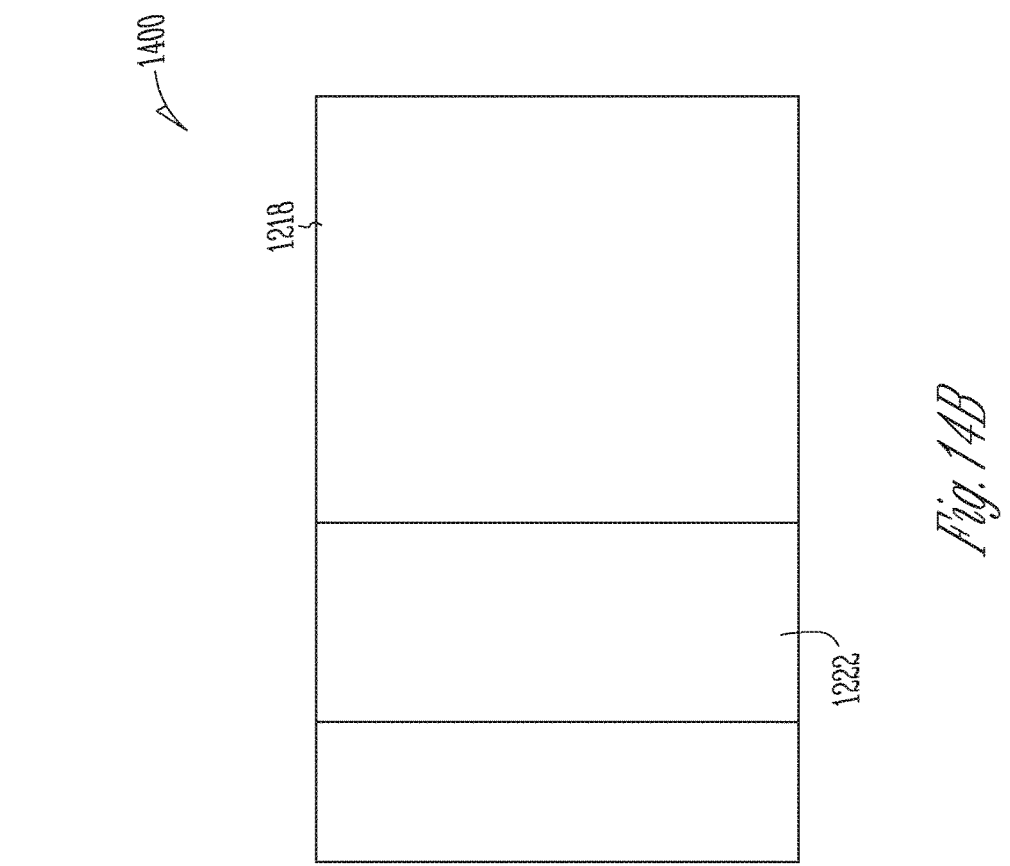
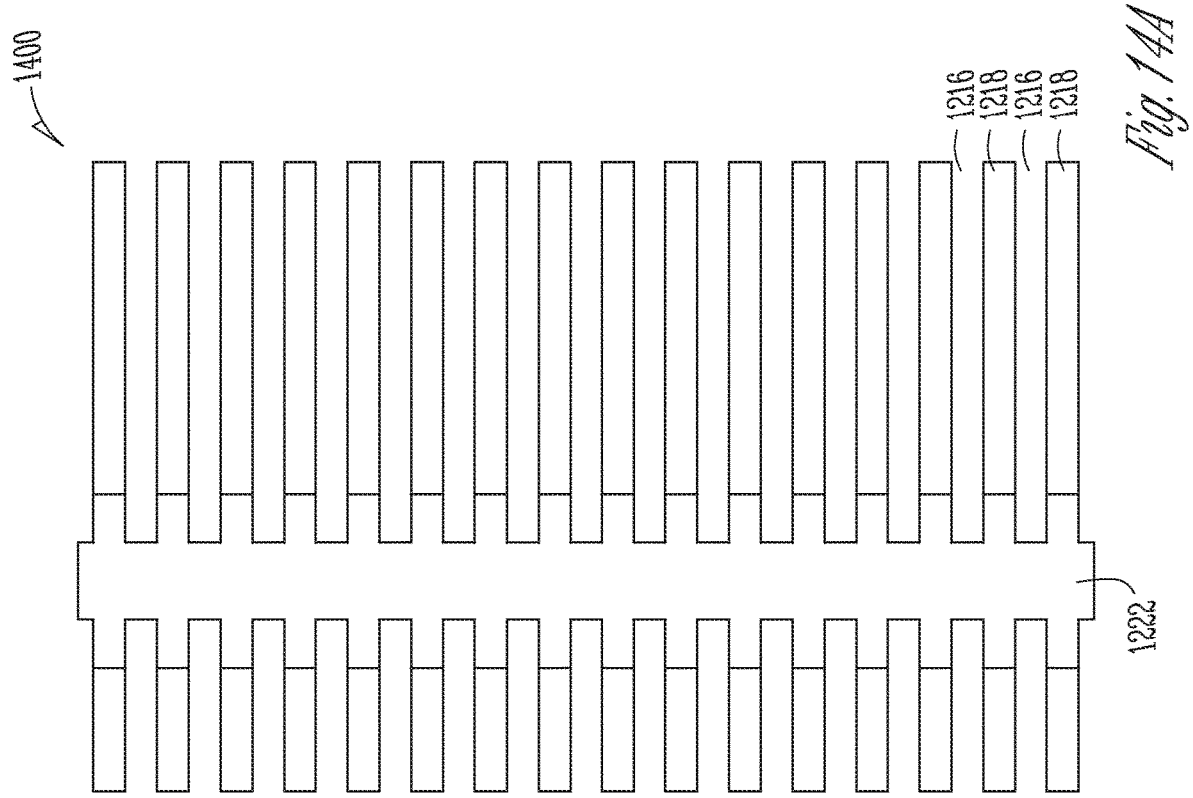

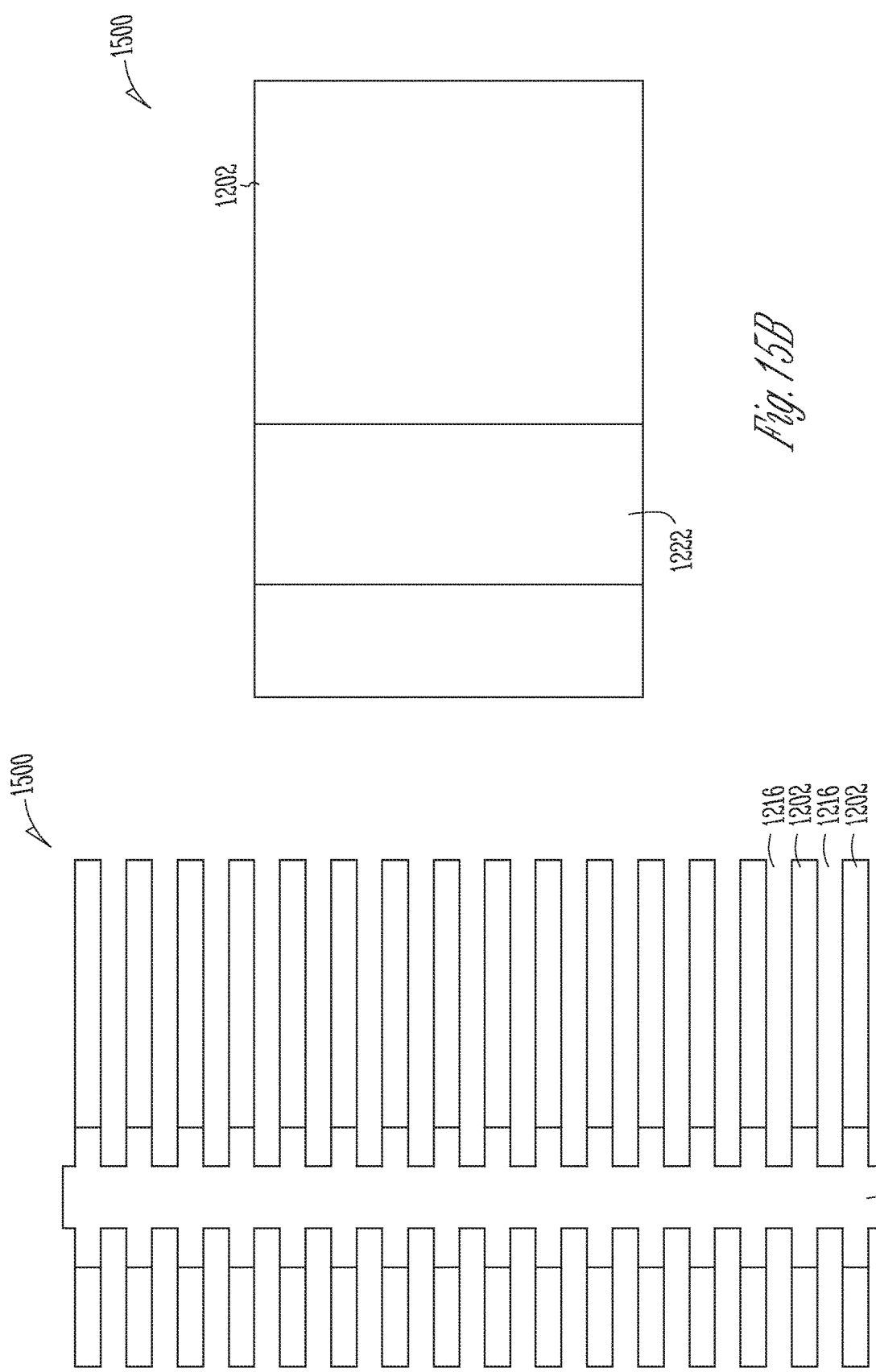

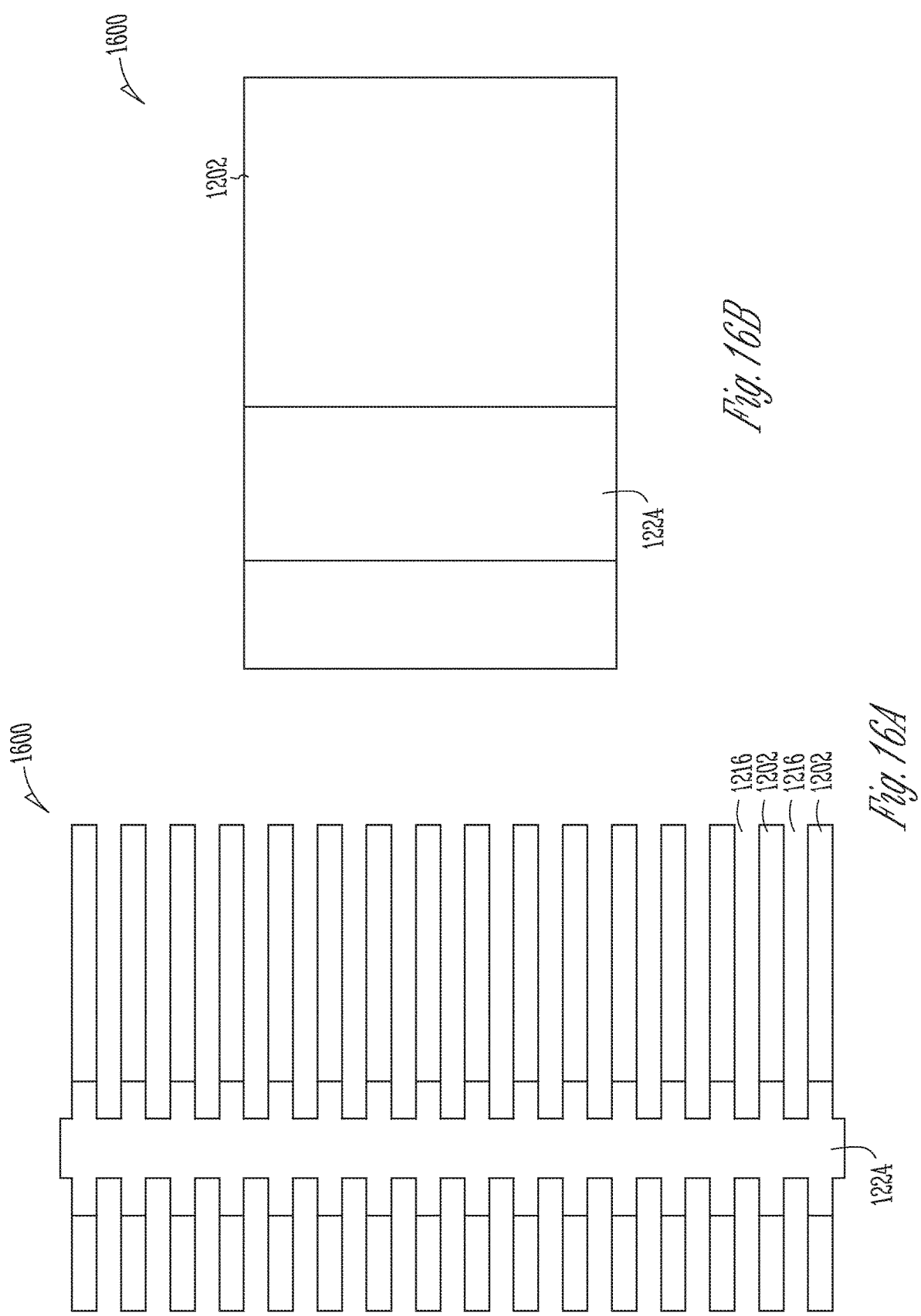

3D NAND MEMORY Z-DECODER

CLAIM OF PRIORITY

This application is a continuation and claims the benefit of priority under 35 U.S.C. § 120 to U.S. application Ser. No. 16/107,357, filed Aug. 21, 2018, which is a continuation of and claims the benefit of priority under 35 U.S.C. § 120 to U.S. application Ser. No. 15/606,493, filed on May 26, 2017, now issued as U.S. Pat. No. 10,074,431, which is a continuation of and claims the benefit of priority under 35 U.S.C. § 120 to U.S. application Ser. No. 15/148,408, filed on May 6, 2016, now issued as U.S. Pat. No. 9,679,650, each of which are herein incorporated by reference in their entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random access memory (DRAM), or synchronous dynamic random access memory (SDRAM), among others.

Non-volatile memory can retain stored data when not powered, and includes flash memory, read-only memory (ROM), electrically erasable programmable ROM (EEPROM), erasable programmable ROM (EPROM), resistance variable memory, such as phase change random access memory (PCRAM), resistive random access memory (RRAM), or magnetoresistive random access memory (MRAM), among others.

Flash memory is utilized as non-volatile memory for a wide range of electronic applications. Flash memory devices typically include one or more groups of one-transistor, floating gate memory cells that allow for high memory densities, high reliability, and low power consumption.

Two common types of flash memory array architectures include NAND and NOR architectures, named after the logic form in which the basic memory cell configuration of each is arranged. The floating gate memory cells of the memory array are typically arranged in a matrix. The gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a column of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of the row of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), and a triple-level cell (TLC) can refer to a memory cell that can store three bits of data per cell (e.g., one of eight programmed states). In other examples, MLC can refer to any memory cell that can store more than one bit of data per cell, or can represent one of more than two programmed states.

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Memory arrays or devices can be combined together to form a storage volume of a memory system, such as a solid state drive (SSD). An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other electromechanical delay associated with magnetic disk drives. SSDs may also use non-volatile flash memory cells to obviate internal battery supply requirements, thus allowing the drive to be more versatile and compact.

An SSD can include a number of memory devices, including a number of dies or logical units (LUNs). Each die can include a number of memory arrays and peripheral circuitry thereon, and the memory arrays can include a number of blocks of memory cells organized into a number of physical pages. The SSD can receive commands from a host in association with memory operations, such as read or write operations to transfer data (e.g., user data and associated integrity data, such as error data and address data, etc.) between the memory devices and the host, or erase operations to erase data from the memory devices.

OVERVIEW

This document discusses, among other things, an apparatus, such as a three-dimensional (3D) memory structure, having first and second units of vertically arranged strings of memory cells. Each of the first and second units can include multiple tiers of a semiconductor material, including multiple tiers of memory cells. Each tier of memory cells can include an access line of at least one memory cell. The apparatus can include a first decoder transistor coupled to the first unit, and a second decoder transistor coupled to the second unit. The access line of a first tier of the first unit can be selectively coupled to a first drive transistor through the first decoder transistor. The access line of a first tier of the second unit can be selectively coupled to the first drive transistor through the second decoder transistor. The access line of the first tier of the first unit can be selectively coupled to the access line of the first tier of the second unit through the first and second decoder transistors.

Each of the first and second units of the vertically arranged strings of memory cells can include pillars of a semiconductor material extending through each of the multiple tiers. The pillars can include, for example, a first pillar having a channel of at least one of the memory cells and a second pillar having a gate of at least one of the decoder transistors. The channels of the decoder transistors or the memory cells can include at least one of a source or a drain.

In an example, a source of a decoder transistor of the first tier (e.g., TIER0) of the first unit of memory cells can be coupled to a respective source of a decoder transistor of the first tier (e.g., TIER0) of the second unit of memory cells; a source of a decoder transistor of the second tier (e.g., TIER1) of the first unit of memory cells can be coupled to a respective source of a decoder transistor of the second tier (e.g., TIER1) of the second unit of memory cells; etc. In other examples, the drains of the decoder transistors of corresponding tiers can be coupled instead of the sources, or the channels of corresponding tiers can otherwise be coupled.

Methods of forming such apparatus are also disclosed, as well as methods of operation, and other embodiments.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 11A-C illustrate example perspective, side, and top profile views, respectively, of a 3D NAND architecture semiconductor memory device.

FIGS. 12A-17B illustrate example process steps for making a Z-axis decoder circuit in a 3D NAND architecture semiconductor memory device.

DETAILED DESCRIPTION

In three-dimensional (3D) architecture semiconductor memory technology, as the number of tiers of a memory device increases, such as by stacking vertical structures, the number of physical pages in the memory device will increase. As the number of physical pages increases, the number of string drivers required to drive the memory cells of the memory device will increase. The present inventor has recognized, among other things, a vertical decoder structure configured to reduce the number of string drivers required for a 3D memory structure, while reducing power consumption and, in certain examples, lowering current requirements and reducing the block size for each individual string driver.

Figure 1:
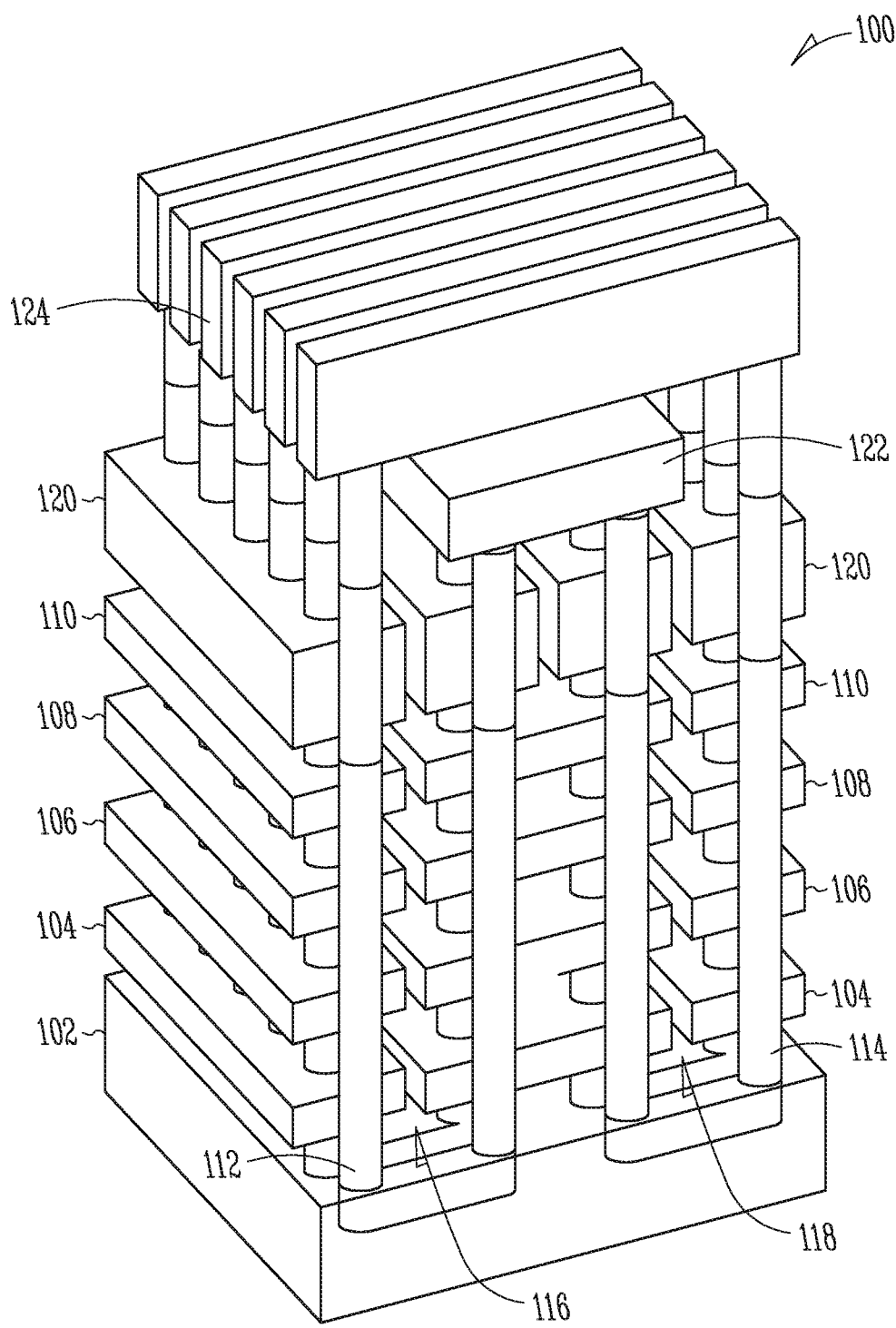
FIGS. 1-2 illustrate example three-dimensional views of a 3D NAND architecture semiconductor memory device.

FIG. 1 illustrates an example three-dimensional view of a 3D NAND architecture semiconductor memory device 100 on a substrate 102 according to various embodiments, depicting functional structures defining the architecture, including access lines (e.g., word lines) 104, 106, 108, 110, U-shaped pillars 112, 114, select gates 120, a source line 122, and data lines (e.g., bit lines) 124. Memory device 100 represents a portion of a greater number of similar structures that would typically be found in a block, device, or other unit of NAND memory.

The example memory device 100 includes multiple tiers of memory structures, including first, second, third, and fourth access lines 104, 106, 108, 110 that at least partially surround charge storage structures (e.g., floating gates) of respective pluralities of charge storage transistors (e.g., memory cells), each including a source, a drain, and a control gate. In the memory device 100 illustrated in FIG. 1, each of the separate first, second, third, and fourth access lines 104, 106, 108, 110 are located at separate tiers of the memory device 100. Although shown with four tiers of access lines in FIG. 1 for purposes of illustration, in various examples in actual devices, the memory device 100 can include a greater number of tiers of access lines, such as 8, 16, 32, 64, etc.

The memory device 100 can include a plurality of U-shaped pillars that function as channels for the charge storage transistors. Although illustrated as having 12 U-shaped pillars in FIG. 1 for purposes of illustration, including first and second U-shaped pillars 112, 114, the memory device 100 can include greater or fewer U-shaped pillars, as desired. Each of the first and second U-shaped pillars 112, 114 can extend into the substrate 102, and can be separated by first or second vertical slots 116, 118, respectively. The first and second U-shaped pillars 112, 114 can include a semiconductor material, such as polysilicon, which in many examples will be formed as a tube (hollow cylinder) of polysilicon defining a central aperture, with a dielectric material filling the aperture.

The memory device 100 can include select transistors formed at each end of the first and second U-shaped pillars 112, 114, and select gates 120 surrounding the select transistors. The source line 122 can be formed on the select transistors at first ends of the first and second U-shaped pillars 112, 114, and the data lines (e.g., bit lines) 124 can be formed on the select transistors at second ends of the first and second U-shaped pillars 112, 114.

In certain examples, one or more of the tiers of semiconductor material can function as a body of a peripheral transistor, such as a decoder transistor, driver, or one or more other peripheral circuits for the memory device 100.

Although illustrated in FIG. 1 using U-shaped pillars 112, 114, the 3D NAND architecture semiconductor memory device 100 can, in other examples, be formed in one or more other shapes of pillars, including substantially vertical (and not U-shaped) pillars having source and data lines at respective first and second ends. Further, in certain examples, the memory device 100 can include multiple vertical structures stacked upon one another, such as illustrated in the commonly assigned U.S. Pat. No. 8,964,474, issued to Midori Morooka et al., and titled "Architecture for 3-D NAND Memory," incorporated by reference herein in its entirety, including its disclosure of stacked arrays of memory cell strings and respective methods of operation.

Figure 2:
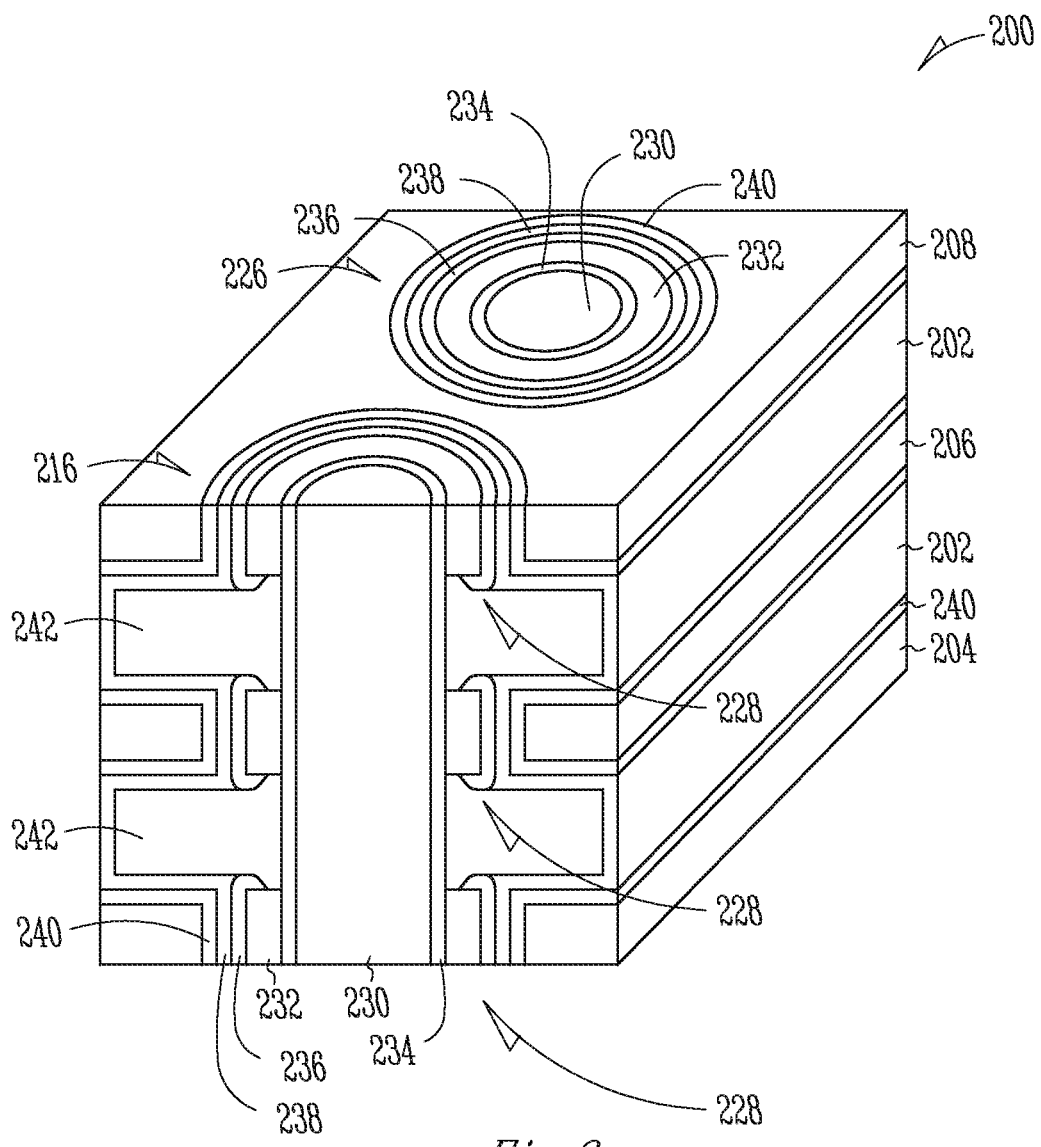

FIG. 2 illustrates an example three-dimensional cross section of a 3D NAND architecture semiconductor memory device 200, including portions of second and third pillars (e.g., U-shaped pillars) 216, 226, first, second, and third access lines 204, 206, 208, and memory cells 228.

Each of the second and third pillars 216, 226 includes a conductive structure 230, preferably a semiconductor material, such as polysilicon. In many examples, the polysilicon will define a central aperture, which will typically be filled with a dielectric material. The portions of the second and third pillars 216, 226 illustrated in FIG. 2 include three individual memory cells 228. Each 3D memory cell 228 includes a volume of semiconductor material, such as, in many examples, a partial ring structure 232 (e.g., p+ type polysilicon, etc.) that functions as a floating gate, separated from the polysilicon of the second and third pillars 216, 226 by a tunnel dielectric 234, and from respective first, second, or third access lines 204, 206, 208 by one or more inter-poly dielectric layers, such as an oxide-nitride-oxide (ONO) structure, including, for example, a first silicon dioxide (SiO2) layer 236, a silicon nitride (Si3N4) layer 238, and a second dioxide layer 240. The respective memory cells 228 are separated from each other by additional tiers of dielectric material 242.

Whereas the memory cells 228 in FIG. 2 include floating gate storage structures, in other examples, other charge storage mechanisms may be utilized, such as charge trapping structures or other forms of storage structures.

Figure 3:
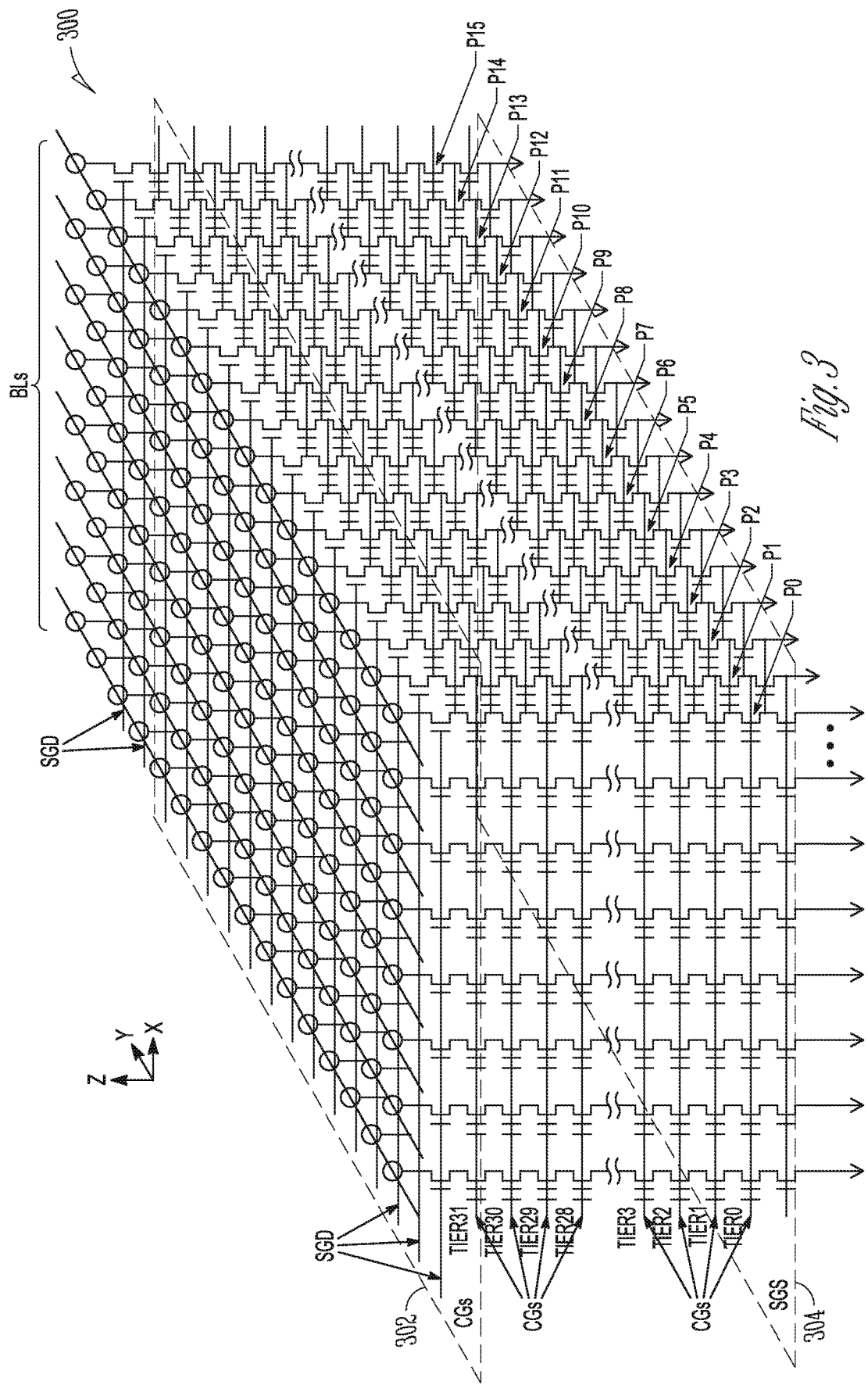
FIGS. 3-4 illustrate example schematic diagrams of a 3D NAND architecture semiconductor memory array.

FIG. 3 illustrates an example schematic diagram of a 3D NAND architecture semiconductor memory array 300 including a plurality of strings of memory cells, each string including 32 tiers (TIER0-TIER31) of charge storage transistors stacked in the Z direction, source to drain, from a source-side select gate (SGS) to a drain-side select gate (SGD). Each string of memory cells in the 3D memory array can be arranged along the Y direction as data lines (e.g., bit lines (BL)), and along the X direction as physical pages (P0-P15). Within a physical page (e.g., P0), each tier represents a row of memory cells, and each string of memory cells represents a column. A block of memory cells can include a number of physical pages (e.g., 128, 384, etc.). In other examples, each string of memory cells can include more or less tiers (e.g., 8, 16, 64, 128, etc.), as well as one or more additional tiers of semiconductor material above or below the charge storage transistors (e.g., select gates, data lines, etc.), as desired.

Each memory cell in the memory array 300 includes a control gate coupled to (e.g., electrically or otherwise operatively connected to) an access line (e.g., word line), which collectively couples the control gates across a specific tier, or a portion of a tier, as desired. Specific tiers in the 3D memory array, and accordingly, specific memory cells in a string, can be accessed or controlled using respective access lines. For example, the memory device 300 includes a first level of semiconductor material 302 (e.g., polysilicon, etc.) that couples the control gates of each memory cell in TIER31, and a second level of semiconductor material 304 that couples the source-side select gates (SGS) of the array. Similar levels of metal or semiconductor material can couple the control gates for each tier. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 4:
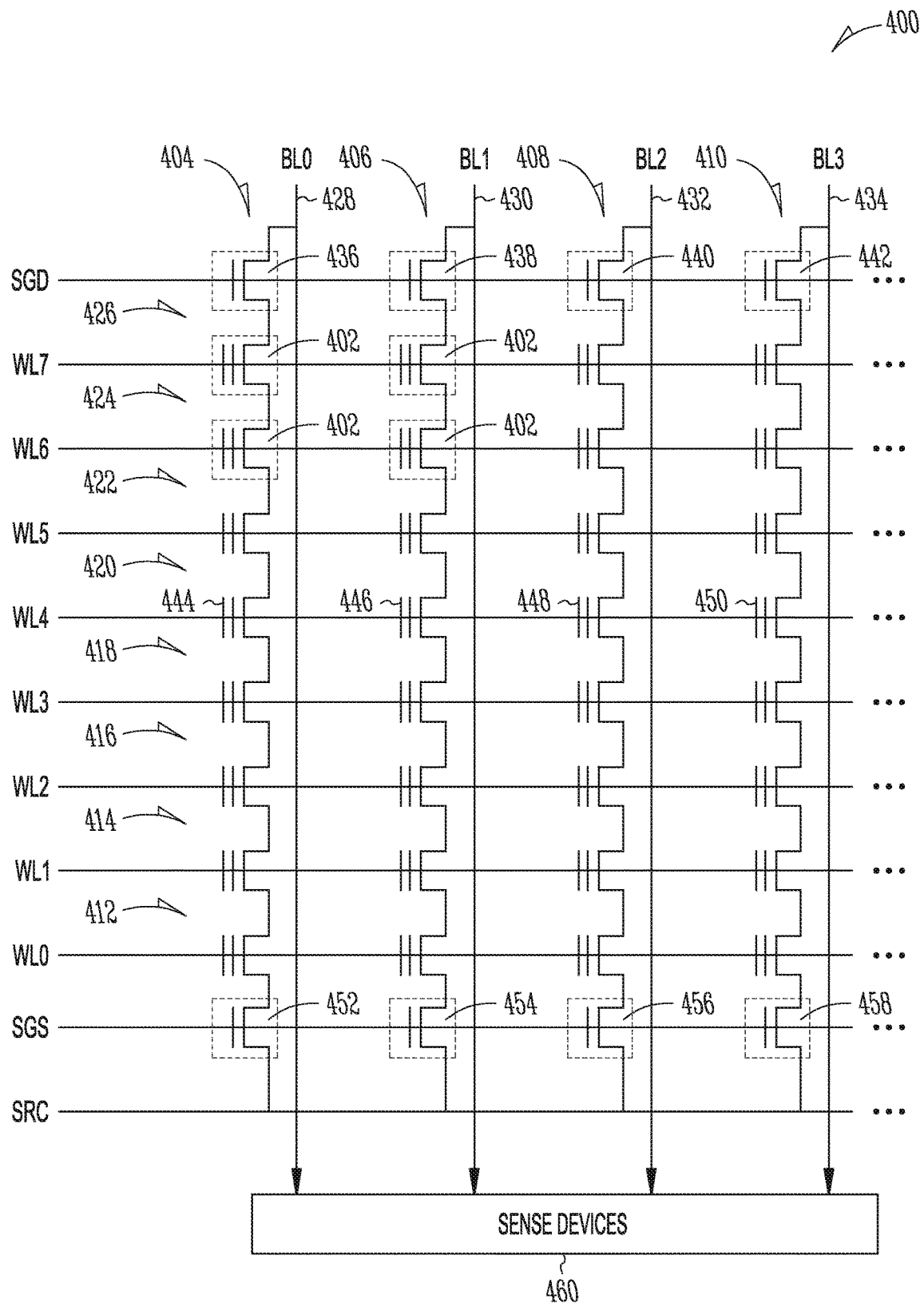

FIG. 4 illustrates an example schematic diagram of a portion of a 3D NAND architecture semiconductor memory array 400 including a plurality of memory cells 402 arranged in a two-dimensional array of strings (e.g., first, second, third, and fourth strings 404-410) and tiers (e.g., TIER0-TIER7 412-426), and sense amplifiers 460. For example, the memory array 400 can illustrate an example schematic diagram of a portion of a physical page of memory cells of a 3D NAND architecture semiconductor memory device. Each string of memory cells is coupled to a source line (SRC) using a respective source-side select gate (SGS) (e.g., first, second, third, or fourth SGS 452-458), and to a respective data line (e.g., first, second, third, or fourth bit lines (BL0-BL3) 428-434) using a respective drain-side select gate (SGD) (e.g., first, second, third, or fourth SGD 436-442). Although illustrated with 8 tiers (TIER0-TIER7 412-426, e.g., using word lines (WL) WL0-WL7) and 4 data lines (BL0-BL3 428-434) in the example of FIG. 4, other examples can include strings of memory cells having more or less tiers (e.g., 16, 32, 64, etc.) or data lines, as desired.

In a NAND architecture semiconductor memory array, such as the example memory array 400, the state of a selected memory cell can be accessed by sensing a current or voltage variation associated with a particular data line containing the selected memory cell. The memory array 400 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL3), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first, second, third, or fourth control gates 444-450 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, such that, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 460, coupled to one or more of the data lines (e.g., first, second, third, or fourth bit lines (BL0-BL3) 428-434), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 5:
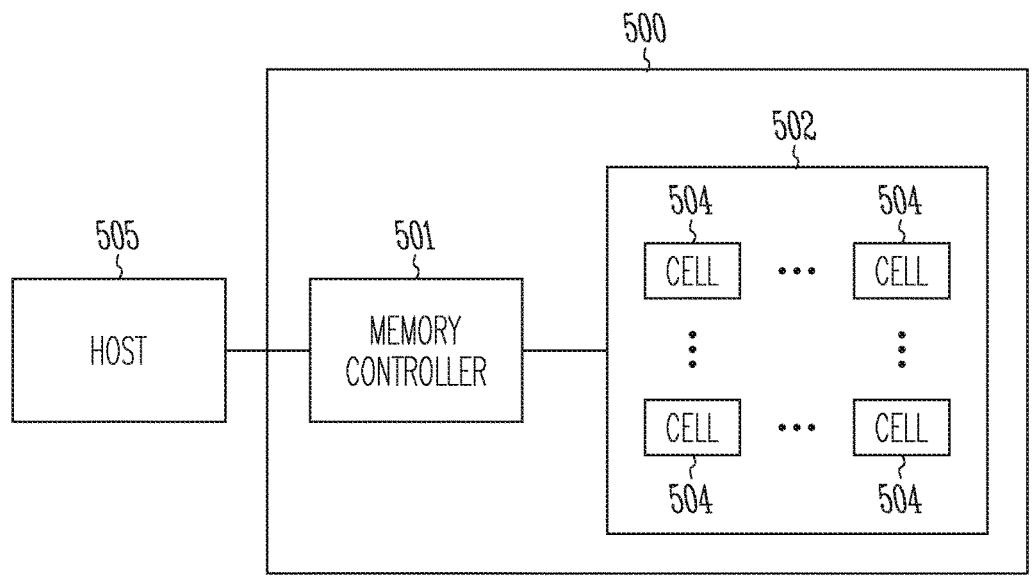
FIG. 5 illustrates an example block diagram of a memory device.

FIG. 5 illustrates an example block diagram of a memory device 500 including a memory controller 501 and a memory array 502 having a plurality of memory cells 504, and a host 505 external to the memory device 500. One or more physical interfaces can be used to transfer data between the memory device 500 and the host 505, such as a serial advanced technology attachment (SATA) interface, a peripheral component interconnect express (PCIe) interface, a universal serial bus (USB) interface, or one or more other physical connectors or interfaces. The host 505 can include a host system, such as a personal computer, a digital camera, a mobile electronic device, a memory card reader, or one or more other electronic devices external to the memory device 500.

The memory controller 501 can receive instructions from the host 505, and can communicate with the memory array 502, such as to transfer data to (e.g., write or erase) or from (e.g., read) one or more of the memory cells 504 of the memory array 502. The memory controller 501 can include, among other things, circuitry or firmware, such as a number of components or integrated circuits. For example, the memory controller 501 can include one or more memory control units, circuits, or components configured to control access across the memory array 502 and to provide a translation layer between the host 505 and the memory device 500. The memory controller 501 can include one or more input/output (I/O) circuits, lines, or interfaces to transfer data to or from the memory array 502.

The memory array 502 (e.g., a 3D NAND architecture semiconductor memory array) can include a number of memory cells 504 arranged in, for example, a number of devices, planes, blocks, or physical pages. As one example, a memory device 500 can include 18,592 bytes (B) of data per page, 1536 pages per block, 548 blocks per plane, and 4 planes per device. Other examples can include other numbers or arrangements.

In operation, data is typically written to or read from the memory device 500 in pages, and erased in blocks. However, one or more memory operations (e.g., read, write, erase, etc.) can be performed on larger or smaller groups of memory cells, as desired. The data transfer size of a memory device is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells 504 or memory arrays 502 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 6:
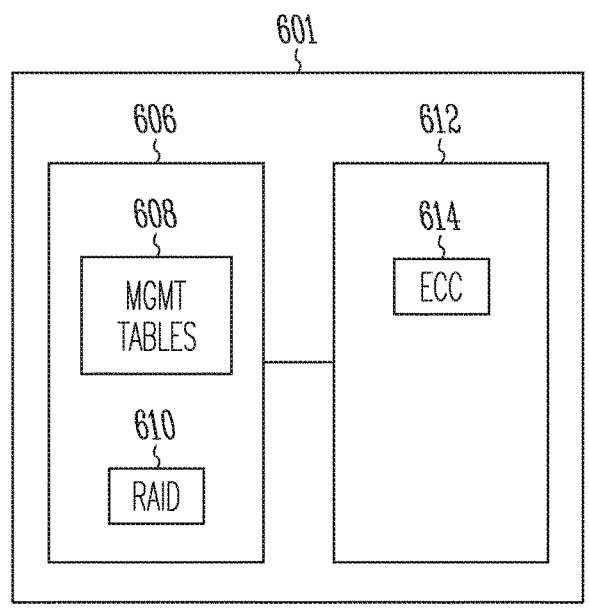
FIG. 6 illustrates an example block diagram of a memory controller.

FIG. 6 illustrates an example block diagram of a memory controller 601 including a memory management component 606 and a memory controller component 612.

The memory management component 606 can include, among other things, circuitry or firmware, such as a number of components or integrated circuits associated with various memory management functions, including wear leveling (e.g., garbage collection or reclamation), error detection or correction, block retirement, or one or more other memory management functions. The memory management component 606 can parse or format host commands (e.g., commands received from a host) into device commands (e.g., commands associated with operation of a memory array, etc.), or generate device commands (e.g., to accomplish various memory management functions) for the memory controller component 612 or one or more other components of a memory device.

The memory management component 606 can include management tables 608 configured to maintain various information associated with one or more component of the memory device (e.g., various information associated with a memory array or one or more memory cells coupled to the memory controller 601). For example, the management tables 608 can include information regarding block age, block erase count, error history, or one or more error counts (e.g., a write operation error count, a read bit error count, a read operation error count, an erase error count, etc.) for one or more blocks of memory cells coupled to the memory controller 601. In certain examples, if the number of detected errors for one or more of the error counts is above a threshold, the bit error can be referred to as an uncorrectable bit error. The management tables 608 can maintain a count of correctable or uncorrectable bit errors, among other things.

The memory management component 606 can include a redundant array of independent disks (RAID) unit 610 (the term "disks" is a carryover from prior implementations using had disk drives, and does not require that the RAID unit 610 include a physical disk). The RAID unit 610 can provide data reliability through, among other things, redundant memory operations.

The memory control component 612 can include, among other things, circuitry or components configured to control memory operations associated with writing data to, reading data from, or erasing one or more memory cells of a memory device coupled to the memory controller 601. The memory operations can be based on, for example, host commands received from a host, or internally generated by the memory management component 606 or the memory control component 612 (e.g., in association with wear leveling, error detection or correction, etc.).

The memory controller component 612 can include an error correction code (ECC) component 614, which can include, among other things, an KC engine or other circuitry configured to detect or correct errors associated with writing data to or reading data from one or more memory cells of a memory device coupled to the memory controller 601. The memory controller 601 can be configured to actively detect and recover from error occurrences (e.g., bit errors, operation errors, etc.) associated with various operations or storage of data, while maintaining integrity of the data transferred between a host and a memory device, or maintaining integrity of stored data (e.g., using redundant RAID storage in the RAID unit 610, etc.), and can remove (e.g., retire) failing memory resources (e.g., memory cells, memory arrays, pages, blocks, etc.) to prevent future errors.

Figure 7:
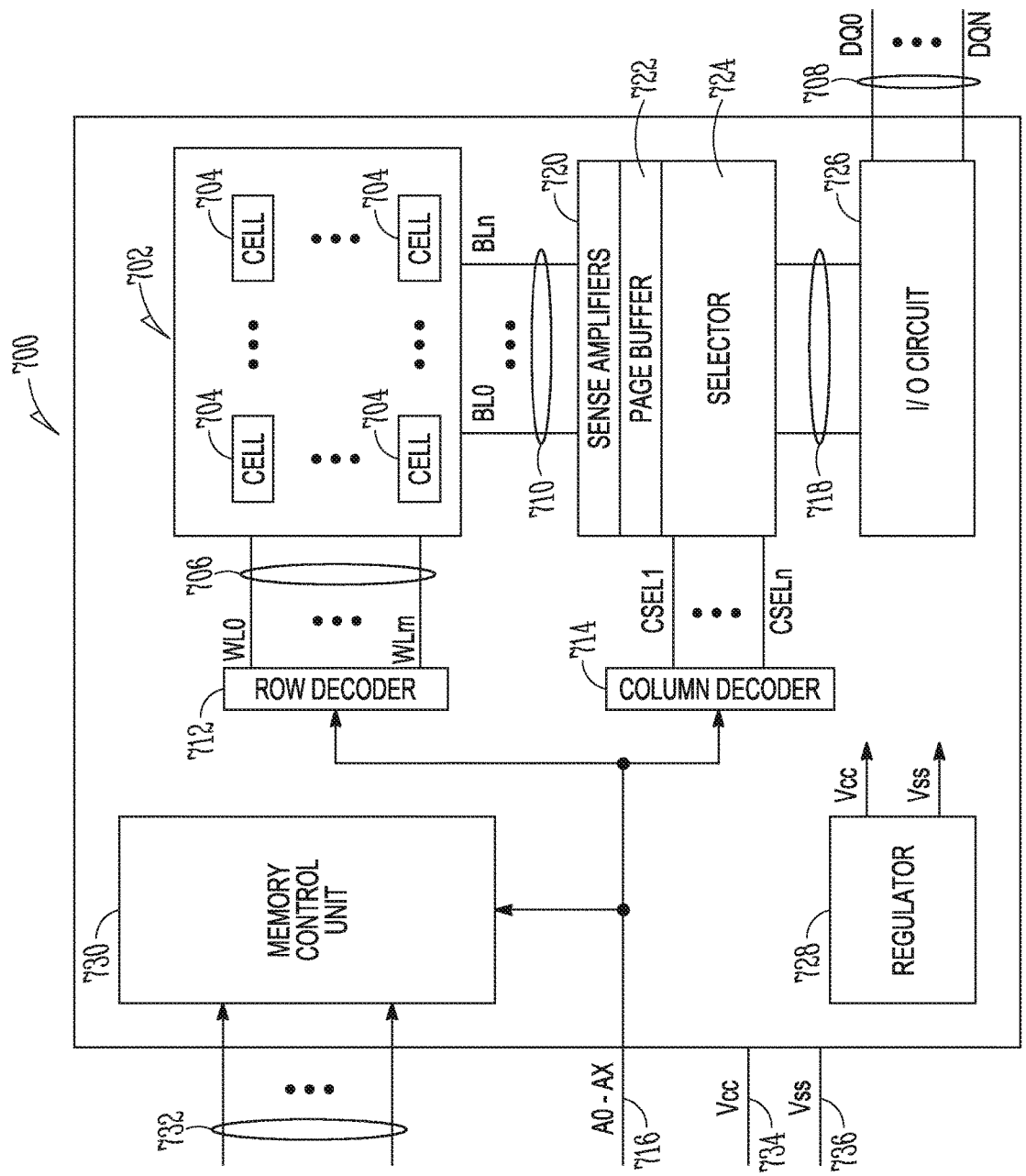
FIG. 7 illustrates an example block diagram of a memory device.

FIG. 7 illustrates an example block diagram of a memory device 700 including a memory array 702 having a plurality of memory cells 704, and one or more circuits or components to provide communication with, or perform one or more memory operations on, the memory array 702. The memory device 700 can include a row decoder 712, a column decoder 714, sense amplifiers 720, a page buffer 722, a selector 724, an input/output (I/O) circuit 726, and a memory control unit 730. The memory cells 704 of the memory array 702 can be arranged in rows, columns, pages, and blocks, and can be accessed using, for example, access lines 706, first data lines 710, or one or more select gates, etc.

The memory control unit 730 can control memory operations of the memory device 700 according to one or more signals or instructions received on control lines 732, including, for example, one or more clock signals or control signals that indicate a desired operation (e.g., write, read, erase, etc.), or address signals (A0-AX) received on an address line 716. One or more devices external to the memory device 700 can control the values of the control signals on the control lines 732, or the address signals on the address line 716. Examples of devices external to the memory device 700 can include, but are not limited to, a host, a memory controller, a processor, or one or more circuits or components not illustrated in FIG. 7.

The memory device 700 can use access lines 706 and first data lines 710 to transfer data to (e.g., write or erase) or from (e.g., read) one or more of the memory cells 704. The row decoder 712 and the column decoder 714 can receive and decode the address signals (A0-AX) from the address line 716, can determine which of the memory cells 704 are to be accessed, and can provide signals to one or more of the access lines 706 (e.g., one or more of a plurality of word lines (WL0-WLm)) or the first data lines 710 (e.g., one or more of a plurality of bit lines (BL0-BLn)), such as described above.

The memory device 700 can include sense circuitry, such as the sense amplifiers 720, configured to determine the values of data on (e.g., read), or to determine the values of data to be written to, the memory cells 704 using the first data lines 710. For example, in a selected string of memory cells, one or more of the sense amplifiers 720 can read a logic level in the selected memory cell in response to a read current flowing in the memory array through the selected string to the data lines 710.

One or more devices external to the memory device 700 can communicate with the memory device 700 using the I/O lines (DQ0-DQN) 708, address lines 716 (A0-AX), or control lines 732. The input/output (I/O) circuit 726 can transfer values of data in or out of the memory device 700, such as in or out of the page buffer 722 or the memory array 702, using the I/O lines 708, according to, for example, the control lines 732 and address lines 716. The page buffer 722 can store data received from the one or more devices external to the memory device 700 before the data is programmed into relevant portions of the memory array 702, or can store data read from the memory array 702 before the data is transmitted to the one or more devices external to the memory device 700.

The column decoder 714 can receive and decode address signals (A0-AX) into one or more column address signals (CSEL1-CSELn). The selector 724 (e.g., a select circuit) can receive the column select signals and select data in the page buffer 722 representing values of data to be read from or to be programmed into memory cells 704. Selected data can be transferred between the page buffer 722 and the I/O circuit 726 using second data lines 718.

The memory control unit 730 can receive positive and negative supply signals, such as a supply voltage (Vcc) 734 and a negative supply (Vss) 736 (e.g., a ground potential), from an external source or supply (e.g., an internal or external battery, an AC-to-DC converter, etc.). In certain examples, the memory control unit 730 can include a regulator 728 to internally provide positive or negative supply signals.

Figure 8:
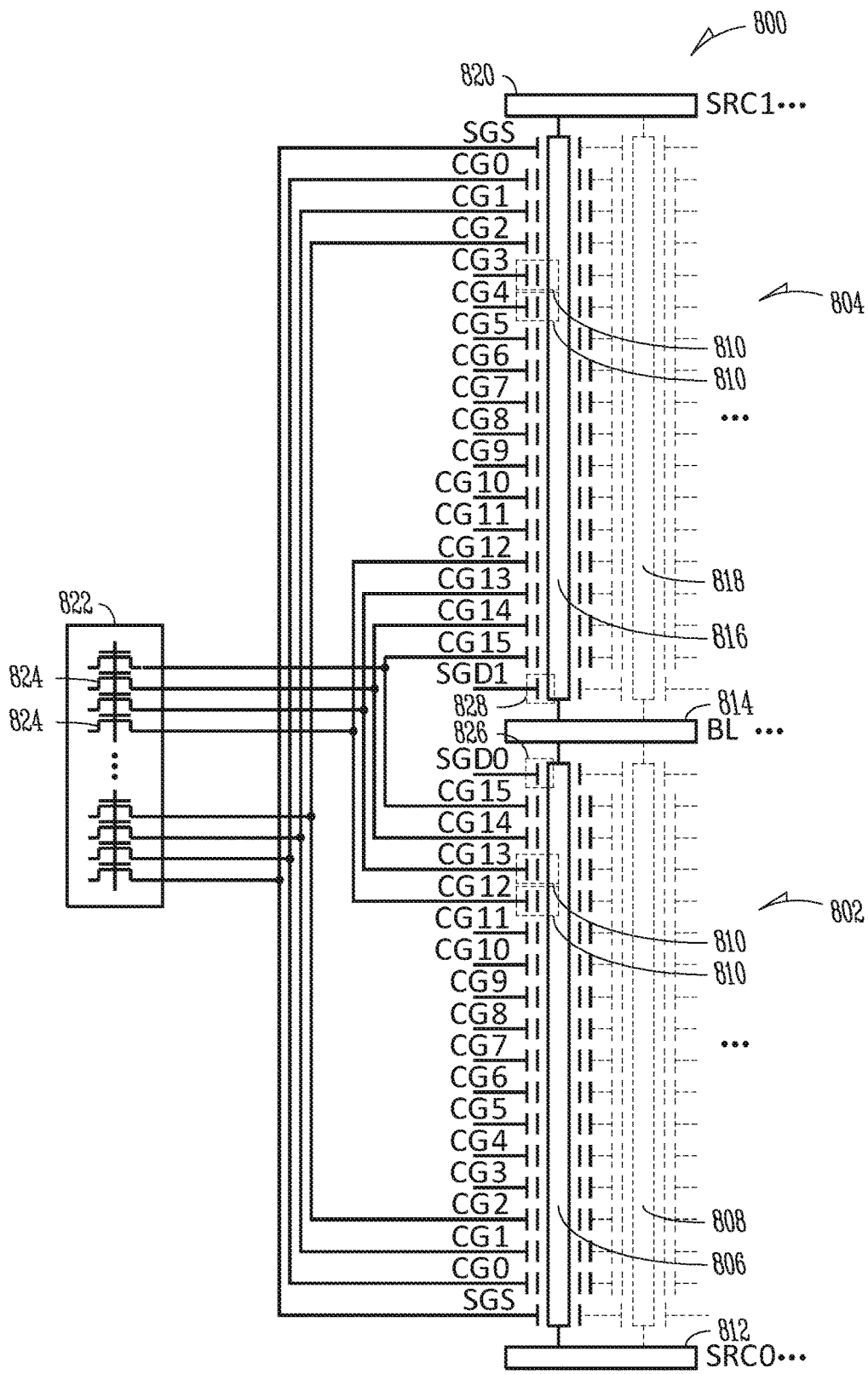
FIGS. 8-9 illustrate example schematic diagrams of a 3D NAND architecture semiconductor memory device.

FIG. 8 illustrates an example schematic diagram of a 3D NAND architecture semiconductor memory device 800 including first and second arrays (e.g., units) of memory cells 802, 804 (e.g., 3D, tiered memory cells) and a string driver 822 (e.g., a high voltage (HV) string driver) having a plurality of driver transistors 824 (e.g., HV driver transistors). In the example of FIG. 8, the second array of memory cells 804 is stacked above (e.g., formed or otherwise disposed vertically relative to) the first array of memory cells 802. In other examples, the memory device 800 can include one or more additional stacked arrays, above or below the first or second arrays of memory cells 802, 804, as desired.

Each array of memory cells can include a plurality of strings of memory cells, each string of memory cells having a plurality of tiers. In the example of FIG. 8, the first array of memory cells 802 includes first and second strings of memory cells 806, 808 between a first source line (SRC0) 812 and a first data line (BL) 814, and the second array of memory cells 804 includes third and fourth strings of memory cells 816, 818 between the first data line 814 and a second source line (SRC1) 820. However, each array of memory cells can include more than two strings. In other examples, the first and second arrays of memory cells 802, 804 can share a source line and have separate data lines (instead of sharing a data line and having separate source lines, as illustrated in FIG. 8).

Each string of memory cells includes a plurality of memory cells 810 (e.g., 16), a source-side select gate (SGS), and a drain-side select gate (SGD) in a substantially vertical pillar between a source line (e.g., the first or second source lines (SRC0, SRC1) 812, 820) and a data line (e.g., the first data line (BL) 814). The first array of memory cells 802 includes a first drain-side select gate (SGD0) 826, and the second array of memory cells 804 includes a second drain-side select gate (SGD1) 828.

Each memory cell 810 in the first and second arrays of memory cells 802, 804 includes a control gate coupled to a respective access line (e.g., word line) (CG0-CG15) at a specific tier of the memory device 800, which collectively couples the control gates across the specific tier, or a portion of the tier, of each vertical pillar of a respective array.

In traditional memory devices, a separate driver transistor can be required for each tier or access line (e.g., word line) for each separate array of memory cells in a memory device, such as to provide a programming voltage, a pass voltage, or one or more other signals to the access lines, etc. Such driver transistors are typically high-voltage (HV) transistors, which can require a relatively large amount of die area in contrast to the memory cells (e.g., charge storage transistors) of the memory device. In certain examples, one of the plurality of driver transistors 824 can require 100× or more die area than one of the plurality of memory cells 810 (e.g., a 2 um HV driver transistor, and a 20 nm memory cell, etc.). As memory cells are stacked vertically, such driver transistors continue to require more and more die area in contrast to the proportional area of each memory cell. To reduce the number of string drivers, and accordingly, the number of string driver transistors required to operate the first and second arrays of memory cells 802, 804, the control gates for respective tiers or access lines of first and second arrays of memory cells 802, 804 can be coupled, such that a group of arrays can be selected (and accordingly, individual arrays within the group of arrays) using, for example, the first or second drain-side select gates (SGD0, SGD1) 826, 828.

In the example of FIG. 8, the source-side select gate (SGS) and the control gates (CG0-CG15) of the first array of memory cells 802 are coupled to the respective source-side select gate (SGS) and the control gates (CG0-CG15) of the second array of memory cells 804. For example, a first control gate (CG0) of the first array of memory cells 802 is coupled to a first control gate (CG0) of the second array of memory cells 804, a second control gate (CG1) of the first array of memory cells 802 is coupled to a second control gate (CG1) of the second array of memory cells 804, etc. In this example, only the drain-side select gates (SDG0, SDG1) 826, 828 are separated (e.g., not coupled, or individually accessible).

However, as the block size of a memory device increases, or the number of control gates coupled to a string driver (or to each separate driver transistor) increases, the electrical conditions for the string driver (or for each separate driver transistor) change. For example, as more control gates are coupled, the capacitance of the coupled word lines increases, and the available current for each individual control gate decreases, which, in turn, can require larger driver transistors, using more die area, etc.

Figure 9:
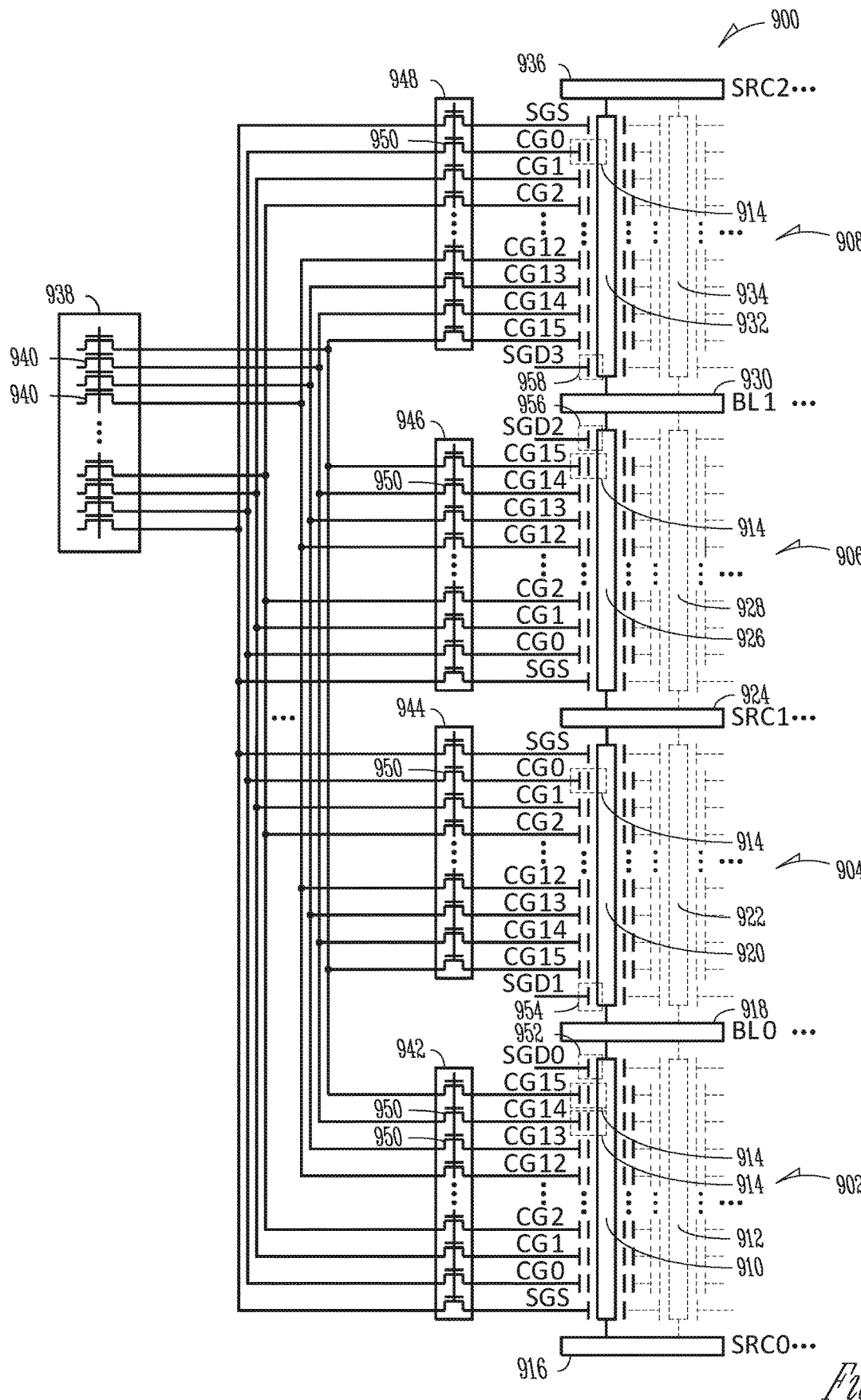

FIG. 9 illustrates an example schematic diagram of a 3D NAND architecture semiconductor memory device 900 including first, second, third, and fourth arrays (e.g., units) of memory cells 902-908, a string driver 938 (e.g., a high voltage (HV) string driver circuit) having a plurality of driver transistors 940 (e.g., HV driver transistors), and first, second, third, and fourth decoder circuits 942-948 having a plurality of decoder transistors 950. In the example of FIG. 9, the second array of memory cells 904 is stacked on top of (e.g., formed or otherwise disposed on) the first array of memory cells 902, the third array of memory cells 906 is stacked on top of the second array of memory cells 904, and the fourth array of memory cells 908 is stacked on top of the third array of memory cells 906. In other examples, the memory device 900 can include one or more additional stacked arrays, above or below the first, second, third, or fourth arrays of memory cells 902-908, as desired.

In an example, the first, second, third, and fourth decoder circuits 942-948 can be referred to as Z-axis decoder circuits (or Z-decoders). As illustrated in FIG. 3, the Z axis can be the vertical axis. Accordingly, the decoder circuits can also be referred to as vertical decoders.

Each decoder transistor 950 in the decoder circuits 942-948 can be configured to selectively couple a select gate, a control gate, or an access line of a tier of an array of memory cells to a corresponding driver transistor using first and second states (e.g., "on" and "off" states, high and low impedance states, etc.), and can further be coupled to a corresponding decoder transistor for one or more other decoder circuits (e.g., a first decoder transistor of the first decoder circuit 942 can be coupled to a first decoder transistor of the second decoder circuit 944, etc.), such that the corresponding driver transistor can be selectively configured to drive tiers from separate arrays of memory cells (e.g., selectively drive both a first tier (TIER0) of the first array of memory cells 902 and a first tier (TIER0) of the second array of memory cells 904, etc).

In the example of stacked arrays of memory cells, the decoder circuits 942-948 can be used to determine which of the stacked arrays are to driven by the string driver 938, and in certain examples, which access lines of which of the stacked arrays are to be driven by the string driver 938.

The decoder circuits 942-948 can be used to selectively couple a plurality of arrays of memory cells (e.g., two or more) to a single string driver, allowing larger block sizes, higher individual cell current, and an increased number of arrays (e.g., units) of memory cells coupled to a single string driver, for example, in contrast to the example illustrated in FIG. 8. The decoder circuits 942-948 can electrically isolate the string driver 938 from control gates (CG0-CG15) of unselected arrays of memory cells (e.g., using an "off" state of one or more of the decoder circuits 942-948, or selected individual decoder transistors 950 in one or more of the decoder circuits 942-948), and thus, can electrically isolate the driver transistors 940 from the capacitance of unselected control gates (CG0-CG15), which, in certain examples, can increase the individual available cell current for each selected memory cells.

Each array of memory cells can include a plurality of strings of memory cells, each string of memory cells having a plurality of tiers. In the example of FIG. 9, the first array of memory cells 902 includes first and second strings of memory cells 910, 912 between a first source line (SRC0) 916 and a first data line (BL0) 918; the second array of memory cells 904 includes third and fourth strings of memory cells 920, 922 between the first data line 918 and a second source line (SRC1) 924; the third array of memory cells 906 includes fifth and sixth strings of memory cells 926, 928 between a second source line (SRC1) 924 and a second data line (BL1) 930; and the fourth array of memory cells 908 includes seventh and eighth strings of memory cells 932, 934 between the second data line (BL1) 930 and the third source line (SRC2) 936. However, each array of memory cells can include more than two strings.

Each string of memory cells includes a plurality of memory cells 914, a source-side select gate (SGS), and a drain-side select gate (SGD) in a substantially vertical pillar between a source line (e.g., the first, second, or third source lines (SRC0, SRC1, SRC2) 916, 924, 936) and a data line (e.g., the first or second data lines (BL0, BL1) 918, 930). The first, second, third, and fourth arrays of memory cells 902-908 includes a first drain-side select gate (SGD0) 952, a second drain-side select gate (SGD1) 954, a third drain-side select gate (SGD2) 956, and a fourth drain-side select gate (SGD3) 958, respectively.

Each memory cell 914 in the first, second, third, and fourth arrays of memory cells 902-908 includes a control gate coupled to a respective access line (e.g., word line) (CG0-CG15) at a specific tier of the memory device 900, which collectively couples the control gates across the specific tier, or a portion of the tier, of each vertical pillar of a respective array.

The decoder transistors 950 each include a source, a drain, a gate, and a channel between the source and the drain. The gates across each decoder circuit 942-948 can be coupled and controlled together, can be independently controlled, or combinations thereof. In an example, one or more components or circuits of a memory controller can provide one or more control signals to one or more of the decoder circuits 942-948 (e.g., to the gates of one or more of the decoder circuits 942-948). In an example, the sources of the decoder transistors 950 of a first decoder circuit 942 can be coupled to the sources of the decoder transistors 950 of one or more other decoder circuits, while the drains of the decoder transistors 942 of the first decoder circuit can be coupled to one or more of the select or control gates of one or more of the arrays of memory cells 902-908, or vice versa.

In the example of FIG. 9, the source-side select gate (SGS) and the control gates (CG0-CG15) of each array of memory cells are coupled to the string driver 938 through a respective decoder circuit. For example, a first control gate (CG0) of the first array of memory cells 902 is coupled to a respective driver transistor (e.g., a first driver transistor) of the string driver 938 through a respective decoder transistor (e.g., a first decoder transistor) of the first decoder circuit 942, a second control gate (CG1) of the first array of memory cells 902 is coupled to a respective driver transistor (e.g., a second driver transistor) of the string driver 938 through a respective decoder transistor (e.g., a second decoder transistor) of the first decoder circuit 942, etc. In this example, the drain-side select gates (SDG0, SDG1, SDG2, SDG3) 952-958 are separated (e.g., not coupled, or individually accessible). In other examples, the drain-side select gates (SDG0, SDG1, SDG2, SDG3) 952-958 can be coupled to the string driver 938 through the respective decoder circuits for each array of memory cells, or the source-side select gates (SGS) of each array of memory cells can be separated.

Figure 10:
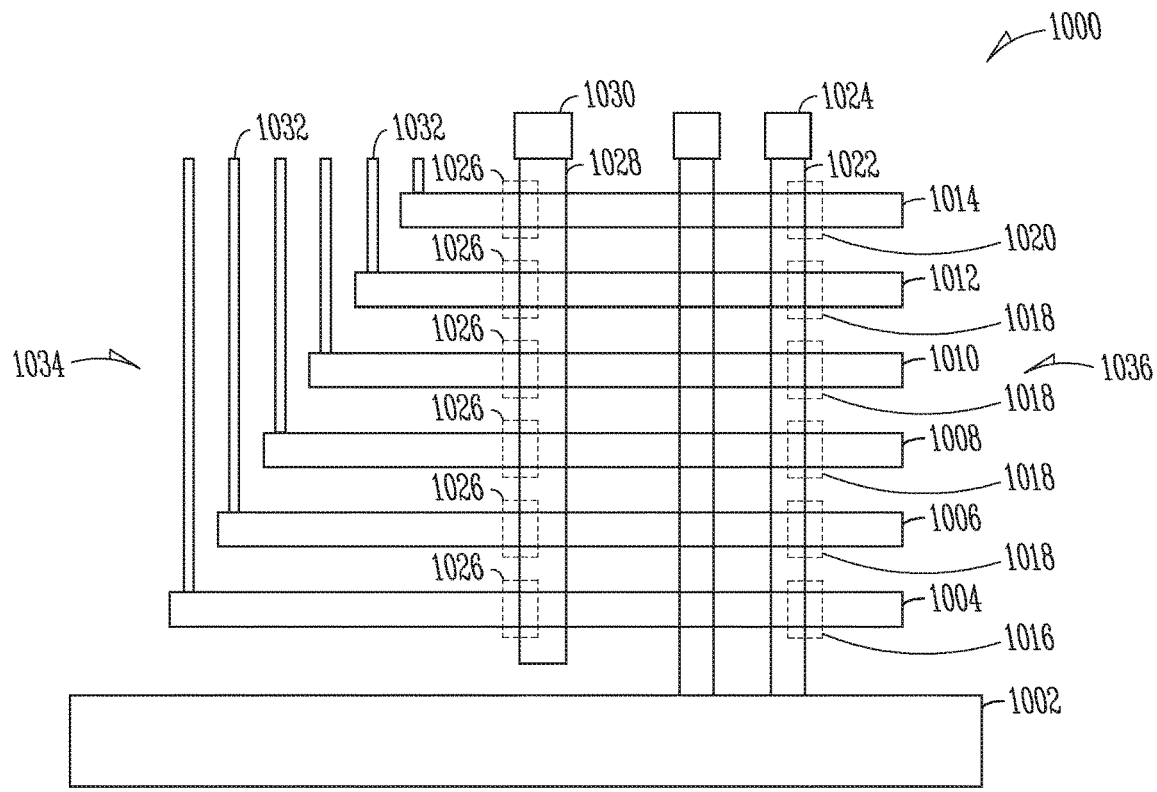
FIG. 10 illustrates an example three-dimensional cross section of a 3D NAND architecture semiconductor memory device.

FIG. 10 illustrates an example three-dimensional cross section of a portion of a 3D NAND architecture semiconductor memory device 1000 on a substrate 1002. The memory device 1000 includes a plurality of tiers of a first semiconductor material (e.g., polysilicon, etc.), and a plurality of pillars of a second semiconductor material (e.g., polysilicon, etc.) extending through at least a portion of the plurality of tiers. The memory device 1000 includes a memory cell portion 1036, and a staircase portion 1034.

The plurality of tiers of the first semiconductor material can include first, second, third, fourth, fifth, and sixth tiers 1004-1014, or more or less tiers, as desired. In certain examples, the plurality of tiers of the first semiconductor material can be interleaved with a dielectric material (not shown), such as silicon dioxide (SiO2), etc.

In the example of FIG. 10, the plurality of pillars of the second semiconductor material includes a first pillar 1022 and a second pillar 1028. The first pillar 1022 includes a source-side select gate (SGS) 1016 at the first tier 1004, one or more memory cells 1018 at each of the respective second, third, fourth, and fifth tiers 1006-1012, and a drain-side select gate (SGD) 1020 at the sixth tier 1014. The memory device 1000 includes a first data line (e.g., bit line (BL)) 1024 at a first end of the first pillar 1022, and a source line at a second end (e.g., in the substrate 1002). In an example, the first pillar 1022 can include a plurality of pillars, each including a plurality of memory cells. The plurality of pillars can include U-shaped pillars, vertical pillars, folded pillars, or pillars having one or more other shapes or orientations, as desired.

The second pillar 1028 can include a plurality of peripheral transistors 1026 between the staircase portion 1034 and the memory cell portion 1036 of the memory device 1000. The peripheral transistors 1026 can include one or more decoder transistors, such as a portion of a Z-axis decoder circuit. The memory device 1000 includes a conductive line 1030 at a first end of the second pillar 1028, configured to control one or more of the peripheral transistors 1026.

In the example of FIG. 10, the staircase portion 1034 includes first, stepped ends of the plurality of tiers of the first semiconductor material, opposite the memory cell portion 1036. One or more of the plurality of tiers of the first semiconductor material can include a vertical conductor (e.g., collectively, vertical conductors 1032), configured to couple a respective tier to another structure or component.

Each of the second, third, fourth, and fifth tiers 10064012 can include an access line for the memory cells 1018 of their respective tier. The first tier 1004 can include an access line for the source-side select gate (SGS) 1016. The sixth tier 1014 can include an access line for the drain-side select gate (SGD) 1020.

The first pillar 1022 can include a source, a channel, or a drain of at least one of the plurality of memory cells 1018 at each tier having a memory cell 1018, and a source, a channel, or a drain of a select gate at each tier having a select gate. In the example of FIG. 10, the first pillar includes a source, a channel, or a drain of each memory cell 1018 at the second, third, fourth, and fifth tiers 1006-1012, and a source, a channel, or a drain of a source-side select gate (SGS) 1016 at the first tier 1004, and of a drain-side select gate (SGD) 1020 at the sixth tier 1014.

One or more of the plurality of tiers can include a source, a channel, or a drain of a respective peripheral transistor, such as a decoder transistor, as desired.

In the example of FIG. 10, each of the tiers 1004-1014 also includes a source, a channel, or a drain of a peripheral transistors 1026.

Figure 11A:
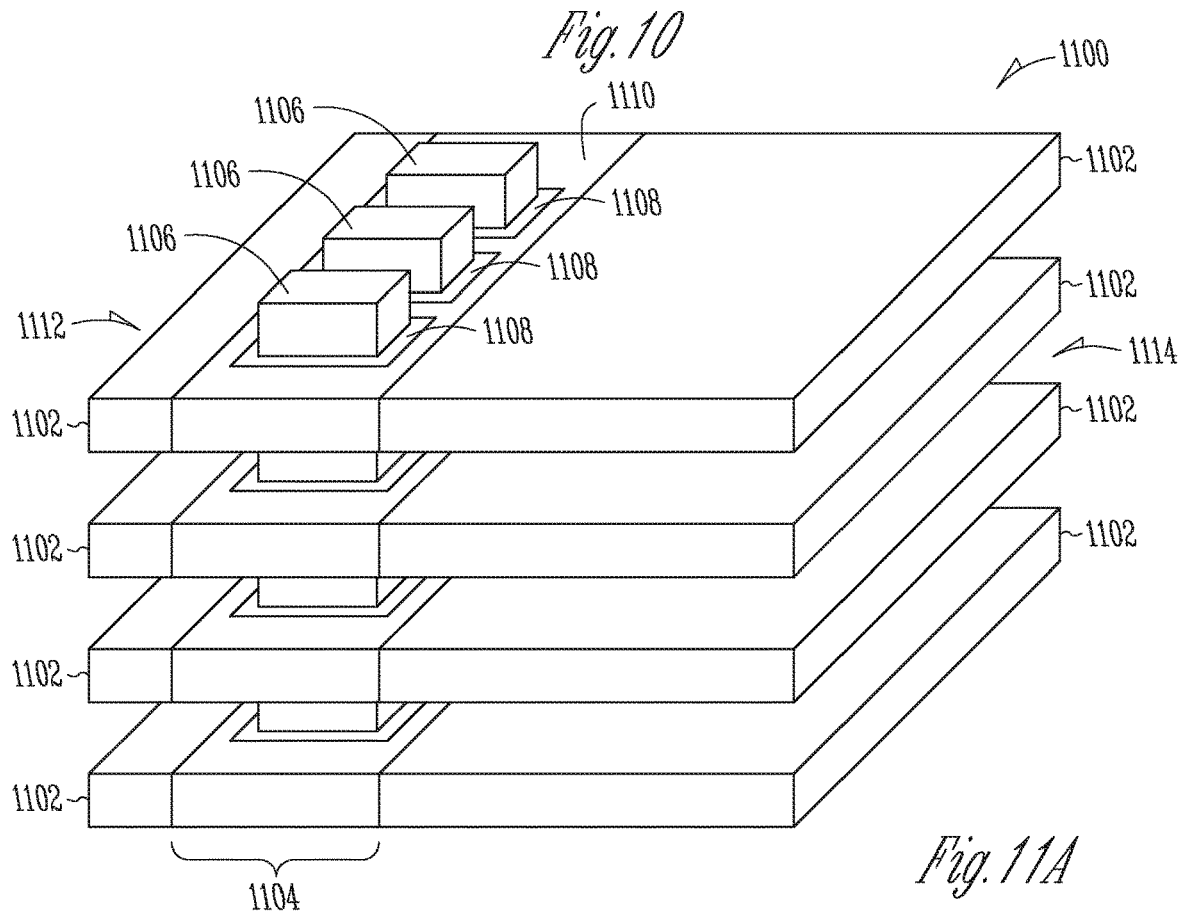

FIGS. 11A-C illustrate example perspective, side, and top profile views, respectively, of a portion of a 3D NAND architecture semiconductor memory device 1100 including a decoder circuit 1104 in conductive tiers 1102 of the memory device 1100, between a staircase portion 1112 of the memory device 1100 and a memory cell portion 1114 of the memory device 1100.

Each conductive tiers 1102 of the memory device 1100 can include a metal replacement material (e.g., titanium nitride (TiN), tantalum (Ta), tantalum nitride (TaN), tungsten (W), etc.), or one or more other of the conductive materials. The space between the conductive tiers 1102 can include a dielectric material, such as silicon dioxide (SiO2), or one or more other dielectric materials.

The decoder circuit 1104 can include a plurality of decoder transistors on one or more conductive tiers 1102 of the memory device 1100, as desired. The decoder transistors can include thin film transistors (TFT), each having a gate 1106, a gate oxide 1108, and a channel 1110 (e.g., a polysilicon channel, etc.). Although illustrated as having four conductive tiers 1102 and three decoder transistors per conductive tier in the example of FIGS. 11A-C, the memory device 1100 can include more or less conductive tiers 1102 or decoder transistors, as desired.

FIGS. 11B-C illustrates an example current flow, when the decoder transistors are in an "on" state, from the staircase portion 1112 of the memory device 1100 (e.g., from a string driver, an HV string driver, etc.) to the memory cell portion 1114 of the memory device 1100. Accordingly, the decoder transistors can electrically isolate selected memory cells of the memory device 1100 from, or electrically couple memory cells of the memory device 1100 to, for example, a string driver, or one or more other components of the memory device, as desired.

FIGS. 12-17 illustrate example process flow to manufacture a decoder circuit (e.g., a Z-axis decoder circuit, etc.), such as that illustrated in the examples of FIGS. 11A-C, in a 3D NAND architecture semiconductor memory device.

FIGS. 12A-B illustrate example cross-section and top views, respectively, of a structure 1200, including interleaving tiers of first and second semiconductor materials 1216, 1218. As used herein, the first and second semiconductor materials 1216, 1218 are used to denote different components of the structure 1200, and not necessarily materials having different semiconductor properties. However, in this example, the first semiconductor material 1216 can include a dielectric material (e.g., an oxide material, such as silicon dioxide (SiO2), etc.) and the second semiconductor material 1218 can include a nitride-containing material (e.g., a nitride material, such as silicon nitride (SiN), etc.). Although illustrates as formed directly one upon the other, such structure is not required and other material layers, such as other electrically insulating layers or similar structures, may be vertically interspersed between the first and second semiconductor materials 1216, 1218.

FIGS. 13A-B illustrate example cross-section and top views, respectively, of a structure 1300, including interleaving tiers of first and second semiconductor materials 1216, 1218 having a slit 1220 etched therein, such as for one or more transistors of a decoder circuit, etc.

FIGS. 14A-B illustrate example cross-section and top views, respectively, of a structure 1400, including a sacrificial semiconductor material 1222 (e.g., polysilicon, etc.) deposited in the slit 1220.

FIGS. 15A-B illustrate example cross-section and top views, respectively, of a structure 1500. In an example, the second semiconductor material 1218 in FIGS. 14A-B can be removed (e.g., etched or otherwise removed) and replaced with a metal replacement material 1202. The metal replacement material 1202 can include, for example, titanium nitride (TiN), tantalum (Ta), tantalum nitride (TaN), tungsten (W), or one or more other metals.

FIGS. 16A-B illustrate example cross-section and top views, respectively, of a structure 1600. In an example, the sacrificial semiconductor material 1222 in FIGS. 15A-B can be removed and replaced with a channel material 1224 (e.g., polysilicon, etc.).

Figure 17B:
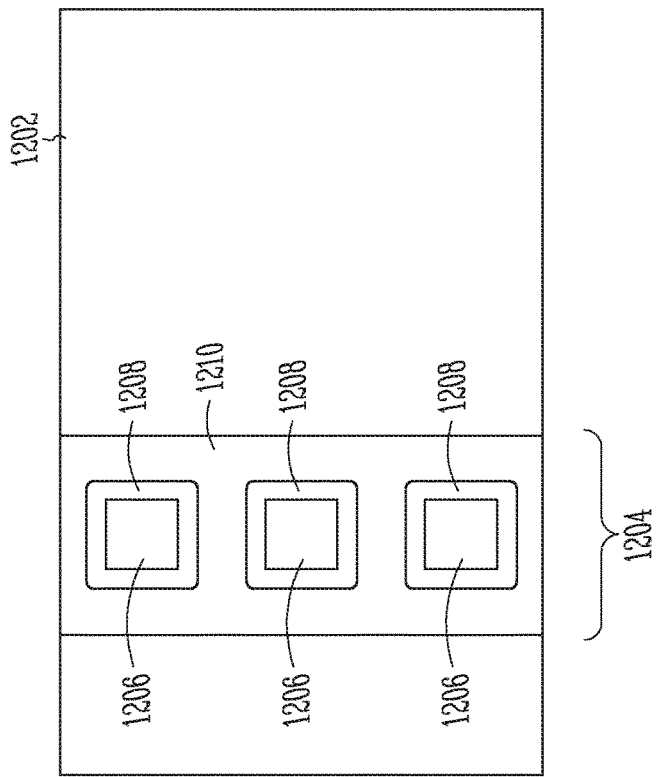
Figure 17A:
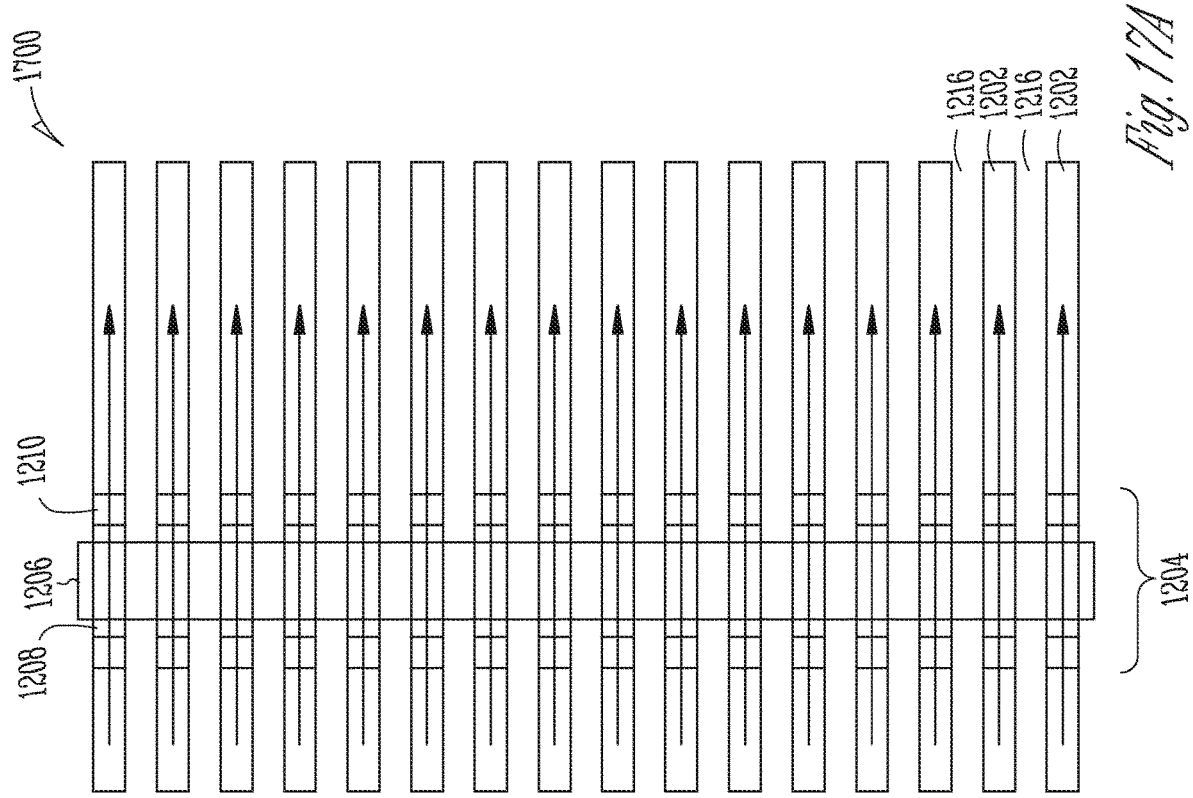

FIGS. 17A-B illustrate example cross-section and top views, respectively, of a portion of a 3D NAND architecture semiconductor memory device 1700. In an example, a slit can be etched in the channel material 1224 in FIGS. 16A-B, and a gate 1206, a gate oxide 1208, and a channel 1210 (e.g., a polysilicon channel, etc.) of a decoder circuit 1204 can be deposited in the slit. The decoder circuit 1204 can include a plurality of decoder transistors on or in one or more tiers of the metal replacement material 1202 of the memory device 1700. The decoder transistors can include thin film transistors (TFT), for example, each having a gate 1206, a gate oxide 1208, and a channel 1210.

Although illustrated as having four tiers of metal replacement material 1202 and three decoder transistors per conductive tier in the example of FIGS. 12-17, in other examples, the memory device 1100 can include more or less conductive tiers 1102 or decoder transistors, as desired.

Figure 18:
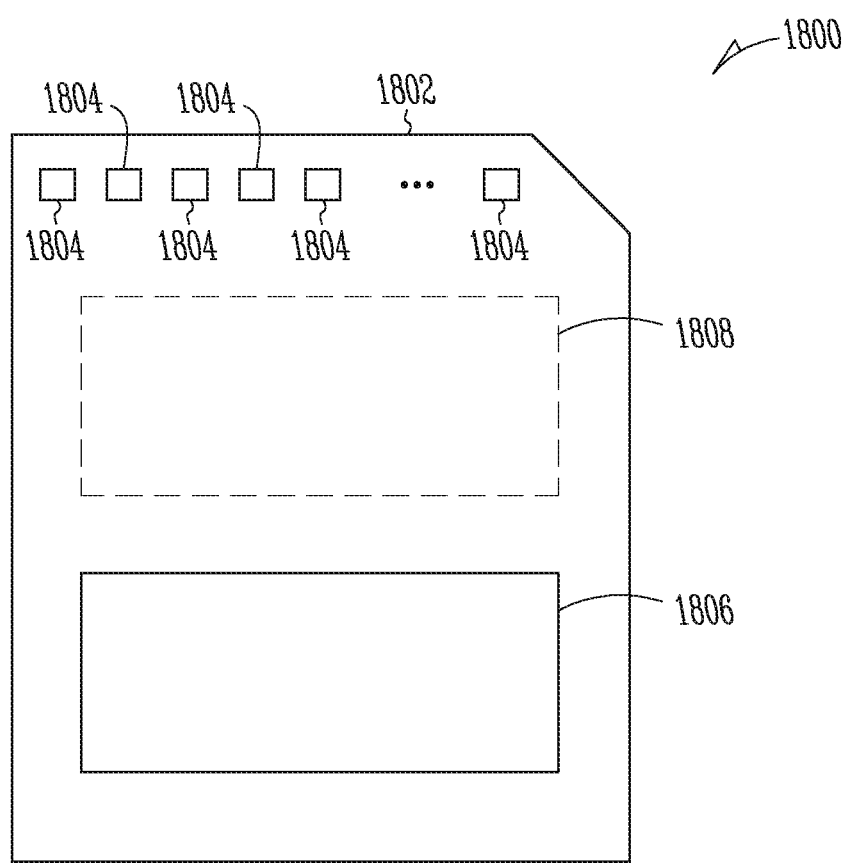
FIG. 18 illustrates an example block diagram of a memory module.

FIG. 18 illustrates an example block diagram of a memory component 1800 (e.g., a memory card) according to various embodiments, including one or more memory devices 1806 (e.g., such as disclosed herein), and optional circuitry 1808. Although illustrated in this example as a memory card, in other examples, the memory module 1800 can include one or more other types of memory module, such as a universal serial bus (USB) flash drive, a solid state drive (SSD), etc.

In certain examples, the memory module 1800 can include a housing 1802 configured to store the one or more memory devices 1806, and a plurality of contacts 1804. The plurality of contacts 1804 can be in the form of one or more standard interfaces (e.g., USB, CompactFlash™, Memory Stick™, SD Secure Digital™, etc.), and can provide access to one or more memory devices 1806 of the memory module 1800 to one or more host devices according to a standard. For certain applications, the housing 1802 is not required.

The optional circuitry 1808 can include one or more circuits or discrete components configured to assist in accessing or managing the one or more memory devices 1806, as desired.

Figure 19:
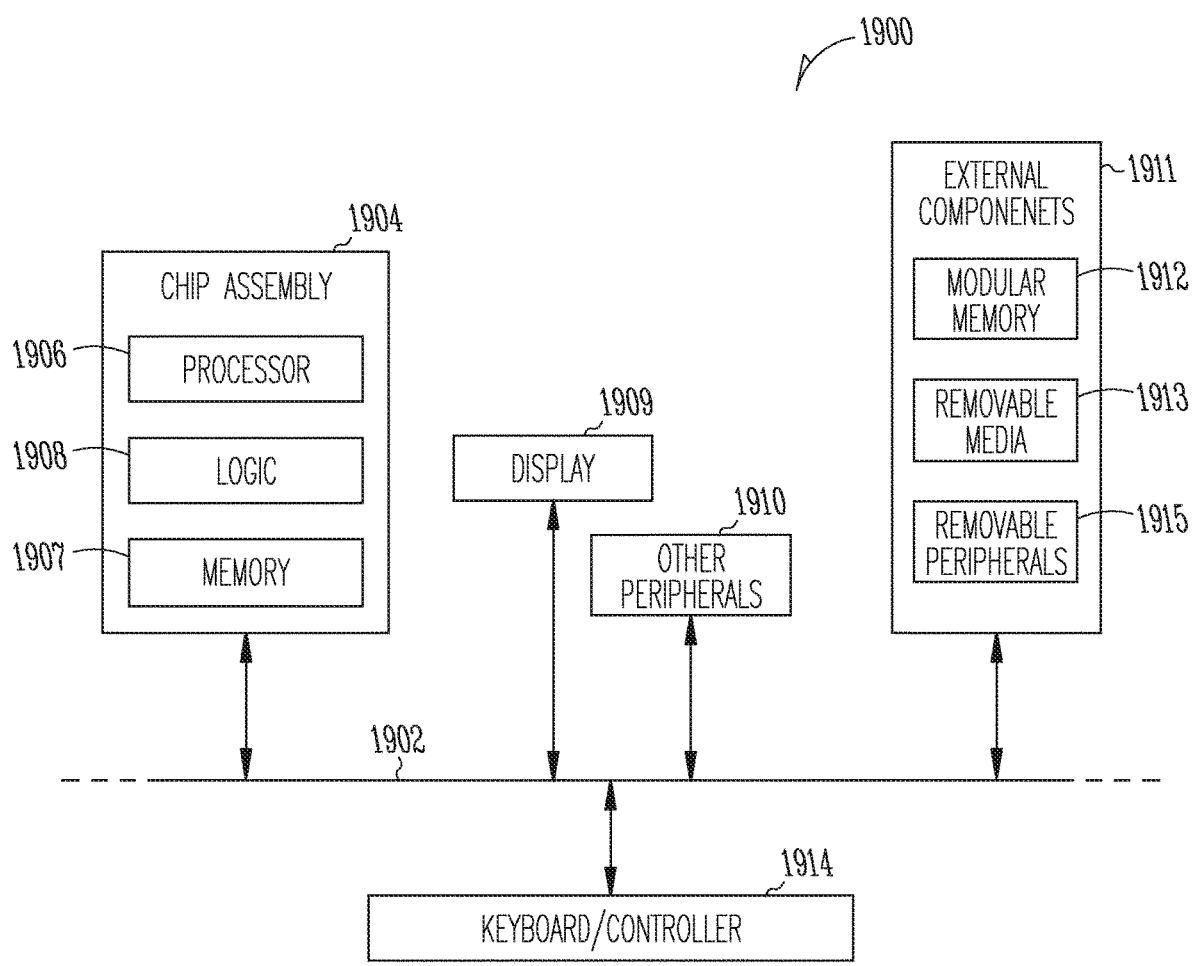
FIG. 19 illustrates an example block diagram of an information handling system.

FIG. 19 illustrates an example block diagram of an information handling system 1900 incorporating at least one chip or chip assembly 1904 that includes a memory device 1907 according to an embodiment of the invention. In an example, the memory device 1907 can include a plurality of stacked arrays of memory cell strings, such as described herein.

The information handling system 1900 illustrated in FIG. 19 can include an electronic computing device, such as a desktop or laptop computer, a tablet computer, a mobile electronic device or smart phone, a gaming console, a vehicle or aircraft, or one or more other electronic device or electronic device components.

The information handling system 1900 includes a system bus 1902 configured to provide communication across various components of the information handling system 1900. The system bus 1902 can be implemented as a single bus, or as a combination of busses.

The chip assembly 1904 can include a processor 1906, one or more additional logic chips 1908, or one or more other components. The one or more additional logic chips 1908 can include, among other things, an analog-to-digital converter (ADC), or one or more other circuits, such as an application-specific integrated circuit (ASIC), etc.

The information handling system 1900 can include one or more external components 1911, such as external memory, which in turn, can include a modular memory 1912, such as one or more hard drives, etc., or one or more removable media 1913 or removable peripherals 1915, such as compact disks (CDs), digital video disks (DVDs), flash drives, and the like. In certain examples, one or more of the memory devices described herein can be one or more the external components 1911.

The information handling system 1900 can also include a display 1909, a keyboard/controller 1914 (e.g., a mouse, touch screen, touch pad, or other user input device), or one or more other peripheral components 1910 (e.g., speakers, microphones, cameras, etc.).

Additional Notes

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus comprising:
   first and second arrays of multiple vertically arranged strings of memory cells, each array comprising multiple tiers of semiconductor material that form respective access lines of multiple memory cells of different strings of memory cells of the respective array, each access line coupling control gates of memory cells of a respective tier across the different strings of memory cells of the respective array;
   a first drive transistor configured to selectively drive a potential to one or more access lines of the first and second arrays;
   a first decoder transistor configured to selectively couple an access line of a first tier of the first array to the first drive transistor; and
   a second decoder transistor configured to selectively couple an access line of a first tier of the second array to the first drive transistor,
   wherein the first and second decoder transistors are configured to selectively couple the access line of the first tier of the first array to the access line of the first tier of the second array.

2. The apparatus of claim 1, comprising:
   a second drive transistor configured to selectively drive a potential to one or more access lines of the first and second arrays;
   a third decoder transistor configured to selectively couple an access line of a second tier of the first array to the second drive transistor; and
   a fourth decoder transistor configured to selectively couple an access line of a second tier of the second array to the second drive transistor,
   wherein the third and fourth decoder transistors are configured to selectively couple the access line of the second tier of the first array to the access line of the second tier of the second array.

3. The apparatus of claim 1, wherein the first and second decoder transistors operate independent of each other, wherein the first and second arrays of multiple vertically arranged strings of memory cells each comprise three-dimensional, tiered memory cells, and wherein each access line of the respective tier couples the control gate of each memory cell of the respective tier across the respective array.

4. The apparatus of claim 1, wherein the first drive transistor is one of a plurality of drive transistors in a string driver comprising a respective drive transistor selectively coupled to each of the multiple tiers of the first and second arrays through a respective decoder transistor, the plurality of drive transistors comprising:

a second drive transistor selectively coupled to an access line of a second tier of the first array through a third decoder transistor, and selectively coupled to an access line of a second tier of the second array through a fourth decoder transistor.

5. The apparatus of claim 1, wherein each of the multiple tiers of semiconductor material form respective access lines of multiple memory cells of different strings of memory cells of the respective array and a channel of a decoder transistor, and wherein a channel of the first decoder transistor of the first tier of the first array is coupled to a channel of the second decoder transistor of the first tier of the second array.

6. The apparatus of claim 5, wherein each of the first and second arrays of multiple vertically arranged strings of memory cells comprise pillars of semiconductor material extending through each of the multiple tiers between a source line and a data line, the pillars comprising a first pillar comprising a channel of at least one of the memory cells and a second pillar comprising a gate of at least one of the decoder transistors.

7. The apparatus of claim 6, wherein the data line of the first array is coupled to the data line of the second array, or wherein the source line of the first array is coupled to the source line of the second array.

8. The apparatus of claim 1, wherein each of the first and second arrays of multiple vertically arranged strings of memory cells comprise additional tiers of semiconductor material, the additional tiers comprising a first additional tier comprising a gate of at least one source-side select gate (SGS) and a second additional tier comprising a gate of at least one drain-side select gate (SGD).

9. The apparatus of claim 1, comprising:

a third array of multiple vertically arranged strings of memory cells that forms respective access lines of multiple memory cells of different strings of memory cells; and a fifth decoder transistor configured to selectively couple an access line of a first tier of the third array to the first drive transistor, wherein the first and fifth decoder transistors are configured to selectively couple the access line of the first tier of the first array to the access line of the first tier of the third array, and wherein the second and fifth decoder transistors are configured to selectively couple the access line of the first tier of the second array to the access line of the first tier of the third array.

10. The apparatus of claim 9, wherein each of the multiple tiers of semiconductor material form respective access lines of multiple memory cells of different strings of memory cells of the respective array and a channel of a decoder transistor, and wherein a channel of the first decoder transistor of the first tier of the first array is coupled to a channel of the second decoder transistor of the first tier of the second array and a channel of the fifth decoder transistor of the first tier of the third array.

11. The apparatus of claim 1, comprising:

a third array of multiple vertically arranged strings of memory cells that forms respective access lines of multiple memory cells of different strings of memory cells;

a second drive transistor configured to selectively drive a potential to one or more access lines of the first and second arrays;

a third decoder transistor configured to selectively couple an access line of a second tier of the first array to the second drive transistor;

a fourth decoder transistor configured to selectively couple an access line of a second tier of the second array to the second drive transistor; and a fifth decoder transistor configured to selectively couple an access line of a first tier of the third array to the first drive transistor, wherein the third and fourth decoder transistors are configured to selectively couple the access line of the second tier of the first array to the access line of the second tier of the second array, wherein the first and fifth decoder transistors are configured to selectively couple the access line of the first tier of the first array to the access line of the first tier of the third array, wherein the second and fifth decoder transistors are configured to selectively couple the access line of the first tier of the second array to the access line of the first tier of the third array, wherein the first, second, third, fourth, and fifth decoder transistors are operable independent of each other, wherein the first, second, and third arrays of multiple vertically arranged strings of memory cells each comprise three-dimensional, tiered memory cells, wherein each access line of the respective tier couples the control gate of each memory cell of the respective tier across the respective array, wherein each of the multiple tiers of semiconductor material form respective access lines of multiple memory cells of different strings of memory cells of the respective array and a channel of a decoder transistor, wherein a channel of the first decoder transistor of the first tier of the first array is coupled to a channel of the second decoder transistor of the first tier of the second array and a channel of the fifth decoder transistor of the first tier of the third array, wherein each of the first and second arrays of multiple vertically arranged strings of memory cells comprise pillars of semiconductor material extending through each of the multiple tiers between a source line and a data line, the pillars comprising a first pillar comprising a channel of at least one of the memory cells and a second pillar comprising a gate of at least one of the decoder transistors, and wherein each of the first and second arrays of multiple vertically arranged strings of memory cells comprise additional tiers of semiconductor material, the additional tiers comprising a first additional tier comprising a gate of at least one source-side select gate (SGS) and a second additional tier comprising a gate of at least one drain-side select gate (SGD).

12. An apparatus comprising:
first and second arrays of multiple vertically arranged strings of memory cells, each array comprising multiple tiers of semiconductor material that form respective access lines of multiple memory cells of different strings of memory cells of the respective array and a channel of a decoder transistor;
wherein a decoder transistor of a first tier of the first array comprises a channel coupled to an access line of the first tier of the first array,
wherein a decoder transistor of a first tier of the second array comprises a channel coupled to an access line of the first tier of the second array,
wherein the channel of the decoder transistor of the first tier of the first array is coupled to the channel of the decoder transistor of the first tier of the second array, and
wherein the decoder transistors of the first tiers of the first and second arrays are configured to selectively isolate the access line of the first tier of the first array from the access line of the first tier of the second array.

13. The apparatus of claim 12, wherein the first and second decoder transistors operate independent of each other, and
wherein each access line of the respective tier couples a control gate of each memory cell of the respective tier across the respective array.

14. The apparatus of claim 12, wherein multiple tiers of the first and second arrays comprise the access line of the multiple memory cells of the respective tier and a channel of a decoder transistor, and
wherein the channel of the decoder transistor of each of the multiple tiers of the first array is coupled to the channel of the decoder transistor of a corresponding tier of the second array.

15. The apparatus of claim 12, wherein each of the first and second arrays of multiple vertically arranged strings of memory cells comprise additional tiers of semiconductor material, the additional tiers comprising a first additional tier comprising a gate of at least one source-side select gate (SGS) and a second additional tier comprising a gate of at least one drain-side select gate (SGD).

16. An apparatus comprising:
first and second arrays of multiple vertically arranged strings of memory cells, each array comprising multiple tiers of semiconductor material that form respective access lines of multiple memory cells of different strings of memory cells of the respective array;
a first decoder transistor configured to selectively couple an access line of a first tier of the first array to a first drive transistor; and
a second decoder transistor configured to selectively couple an access line of a first tier of the second array to the first drive transistor.

17. The apparatus of claim 16, comprising:
a third decoder transistor configured to selectively couple an access line of a second tier of the first array to a second drive transistor; and
a fourth decoder transistor configured to selectively couple an access line of a second tier of the second array to the second drive transistor,
wherein the first and second decoder transistors are configured to selectively couple the access line of the first tier of the first array to the access line of the first tier of the second array, and
wherein the third and fourth decoder transistors are configured to selectively couple the access line of the second tier of the first array to the access line of the second tier of the second array.

18. The apparatus of claim 16, comprising:
a string driver comprising a plurality of drive transistors including the first drive transistor and a second drive transistor,
wherein the first drive transistor is configured to selectively drive a potential to one or more access lines of a first tier of the first and second arrays, and
wherein the second drive transistor is configured to selectively drive a potential to one or more access lines of a second tier of the first and second arrays.

19. The apparatus of claim 16, wherein each of the multiple tiers of semiconductor material form respective access lines of multiple memory cells of different strings of memory cells of the respective array and a channel of a decoder transistor, and
wherein the channel of the decoder transistor of each of the multiple tiers of the first array is coupled to the channel of the decoder transistor of a corresponding tier of the second array.

20. The apparatus of claim 16, wherein each of the first and second arrays of multiple vertically arranged strings of memory cells comprise additional tiers of semiconductor material, the additional tiers comprising a first additional tier comprising a gate of at least one source-side select gate (SGS) and a second additional tier comprising a gate of at least one drain-side select gate (SGD).

* * * * *